United States Patent
Smirnov et al.

(10) Patent No.: US 10,852,247 B2
(45) Date of Patent: Dec. 1, 2020

(54) VARIABLE CORRECTOR OF A WAVE FRONT

(71) Applicants: ASML HOLDING N.V., Veldhoven (NL); ASML NETHERLANDS B.V., Veldhoven (NL)

(72) Inventors: Stanislav Smirnov, Danbury, CT (US); Johannes Matheus Marie De Wit, Helmond (NL); Teunis Willem Tukker, Eindhoven (NL); Armand Eugene Albert Koolen, Nuth (NL)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 128 days.

(21) Appl. No.: 15/664,808

(22) Filed: Jul. 31, 2017

(65) Prior Publication Data
US 2018/0045657 A1 Feb. 15, 2018

Related U.S. Application Data

(60) Provisional application No. 62/373,734, filed on Aug. 11, 2016.

(51) Int. Cl.
*G01B 9/02* (2006.01)
*G01N 21/95* (2006.01)
(Continued)

(52) U.S. Cl.
CPC ......... *G01N 21/9515* (2013.01); *G01N 21/47* (2013.01); *G02B 21/10* (2013.01); *G02B 27/0075* (2013.01); *G03F 7/70616* (2013.01)

(58) Field of Classification Search
CPC ........... G01N 15/0205; G01N 15/0211; G01N 21/9515; G01N 21/47; G01B 11/24;
(Continued)

(56) References Cited

U.S. PATENT DOCUMENTS 3,305,294 A 2/1967 Alvarez
4,457,592 A 7/1984 Baker
(Continued)

FOREIGN PATENT DOCUMENTS

CN 101109907 1/2008
JP H10-242048 9/1998
(Continued)

OTHER PUBLICATIONS

E. P. Goodwin and J. C. Wyant, Field Guide to Interferometric Optical Testing, SPIE Press, Bellingham, WA (2006).*
(Continued)

*Primary Examiner* — Tarifur R Chowdhury
*Assistant Examiner* — Jonathon Cook
(74) *Attorney, Agent, or Firm* — Pillsbury Winthrop Shaw Pittman LLP

(57) ABSTRACT

An optical inspection apparatus, including: an optical metrology tool configured to measure structures, the optical metrology tool including: an electromagnetic (EM) radiation source configured to direct a beam of EM radiation along an EM radiation path; and an adaptive optical system disposed in a portion of the EM radiation path and configured to adjust a shape of a wave front of the beam of EM radiation, the adaptive optical system including: a first aspherical optical element; a second aspherical optical element adjacent the first aspherical optical element; and an actuator configured to cause relative movement between the first optical element and the second optical element in a direction different from a beam axis of the portion of the EM radiation path.

23 Claims, 16 Drawing Sheets

(51) Int. Cl.
*G03F 7/20* (2006.01)
*G02B 21/10* (2006.01)
*G02B 27/00* (2006.01)
*G01N 21/47* (2006.01)

(58) Field of Classification Search
CPC . G01B 11/2441; G01B 11/303; G01B 11/306; G01B 9/02062; G01B 9/02063; G01B 9/02067
USPC .................................................. 356/511, 512
See application file for complete search history.

(56) References Cited

U.S. PATENT DOCUMENTS

| | | | |
|---|---|---|---|
| 5,506,725 A * | 4/1996 | Koike | G02B 21/0068 359/368 |
| 6,104,472 A | 8/2000 | Suzuki | |
| 8,411,287 B2 | 4/2013 | Smilde et al. | |
| 8,867,020 B2 | 10/2014 | Smilde et al. | |
| 9,081,303 B2 | 7/2015 | Cramer et al. | |
| 2003/0011783 A1 | 1/2003 | Suzuki et al. | |
| 2004/0027549 A1 | 2/2004 | Nagayama | |
| 2005/0007603 A1 * | 1/2005 | Arieli | G01J 9/02 356/601 |
| 2008/0024874 A1 | 1/2008 | Uitterdijk et al. | |
| 2008/0137099 A1 | 6/2008 | Hugers | |
| 2009/0284835 A1 * | 11/2009 | Meshulach | G02B 21/0068 359/486.01 |
| 2010/0014065 A1 | 1/2010 | Gruner et al. | |
| 2011/0027704 A1 | 2/2011 | Cramer et al. | |
| 2011/0043791 A1 | 2/2011 | Smilde et al. | |
| 2011/0069295 A1 | 3/2011 | Kraehmer et al. | |
| 2011/0208459 A1 | 8/2011 | Butler et al. | |
| 2012/0010850 A1 * | 1/2012 | Nakauchi | G01B 11/2441 702/167 |
| 2012/0242970 A1 | 9/2012 | Smilde et al. | |
| 2013/0044200 A1 * | 2/2013 | Brill | G02B 21/365 348/79 |
| 2013/0054192 A1 * | 2/2013 | Vankerkhove | G01B 11/24 702/167 |
| 2013/0083306 A1 | 4/2013 | Smirnov et al. | |
| 2013/0162964 A1 | 6/2013 | Thomas et al. | |
| 2013/0278911 A1 | 10/2013 | Limbach et al. | |
| 2014/0063224 A1 * | 3/2014 | Suzuki | H04N 7/18 348/79 |
| 2016/0097984 A1 * | 4/2016 | Singh | G03F 9/7026 250/372 |

FOREIGN PATENT DOCUMENTS

| | | |
|---|---|---|
| JP | 2002-175964 | 6/2002 |
| JP | 2002-310612 | 10/2002 |
| JP | 2005-513757 | 5/2005 |
| JP | 2007-220695 | 8/2007 |
| JP | 2007-316340 | 12/2007 |
| JP | 2008-028388 | 2/2008 |
| JP | 2008-175809 | 7/2008 |
| JP | 2008-186912 | 8/2008 |
| JP | 2013-080921 | 5/2013 |
| JP | 2013-135215 | 7/2013 |
| JP | 2013-197123 | 9/2013 |
| JP | 2014-075610 | 4/2014 |
| JP | 2014-239240 | 12/2014 |
| JP | 2016-510142 | 4/2016 |
| KR | 2003-0071521 | 9/2003 |
| TW | 1424283 | 1/2014 |
| WO | 2009/078708 | 6/2009 |
| WO | 2009/106279 | 9/2009 |

OTHER PUBLICATIONS

Rege, Siddharth S. et al., "Application of the Alvarez-Humphrey concept to the design of a miniaturized scanning microscope", Optics Express 2574, vol. 12, No. 12, 15 pages (2004).

Acosta, Eva et al., "Phase plates for generation of variable amounts of primary spherical aberration", Optics Express 13171, vol. 19, No. 14, 8 pages (2011).

Raasch, Thomas W et al., "Whole-Surface Characterization of Progressive Addition Lenses", Optometry and Vision Science, vol. 88, No. 2, 10 pages (2011).

Wyant, James C. et al., "Basic Wavefront Aberration Theory for Optical Metrology", Applied Optics and Optical Engineering, vol. XI, 53 pages (1992).

Taiwanese Office Action issued in corresponding Taiwanese Patent Application No. 106126687, dated Jun. 6, 2018.

Japanese Office Action issued in corresponding Japanese Patent Application No. 2019-507852, dated Feb. 25, 2020.

Korean Office Action issued in corresponding Korean Patent Application No. 10-2019-7006190, dated Aug. 18, 2020.

* cited by examiner

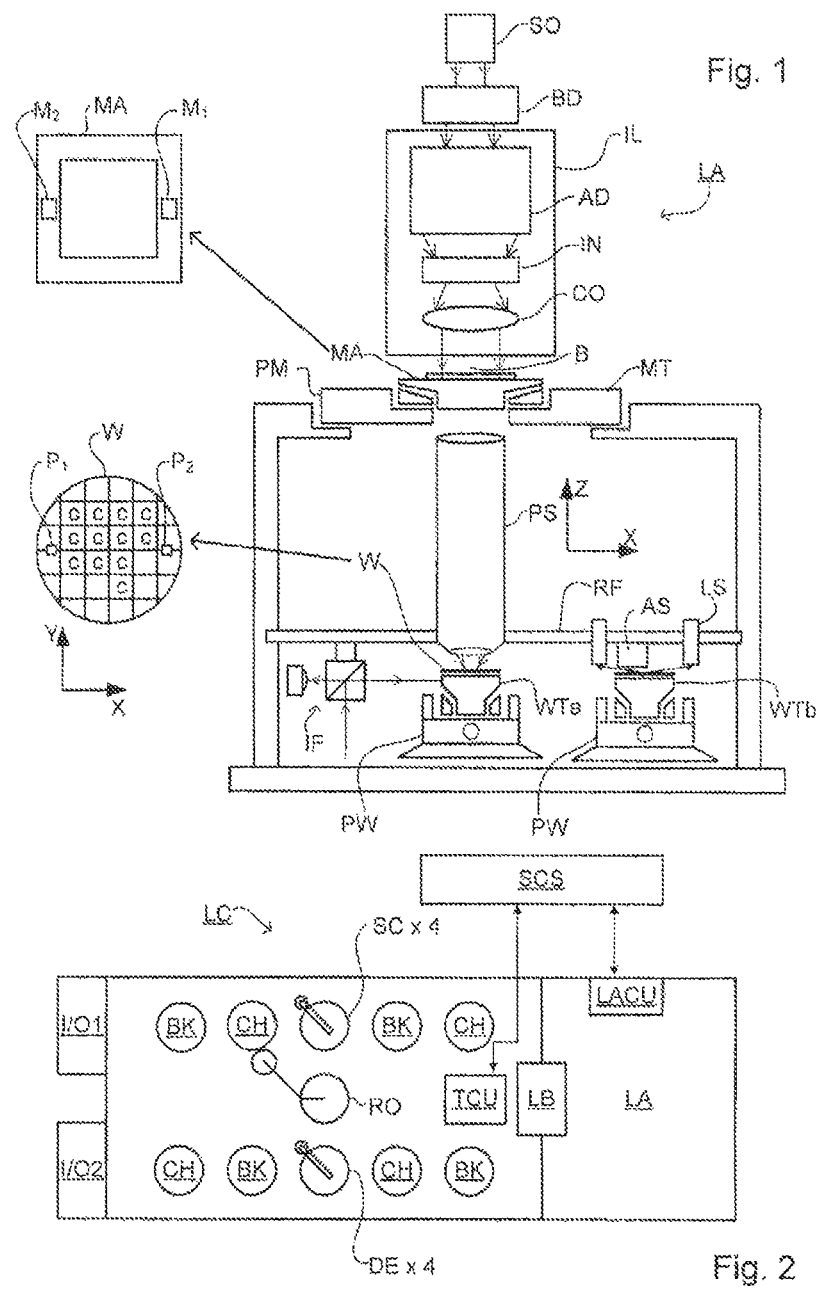

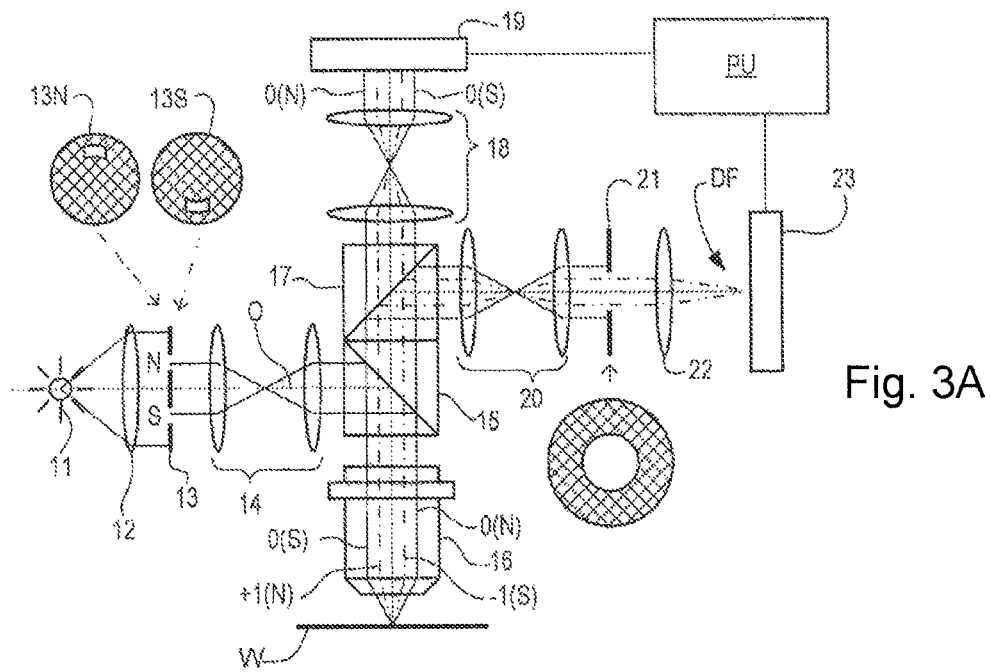
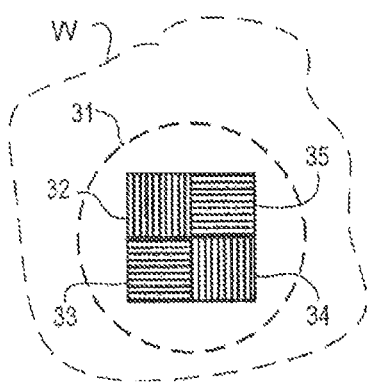
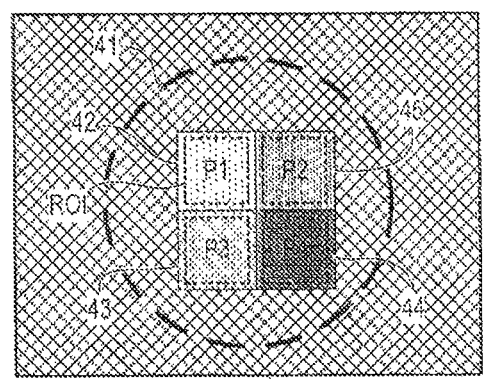
Fig. 3A
Fig. 3B            Fig. 3C            Fig. 3D
Fig. 4A            Fig. 4B

VARIABLE CORRECTOR OF A WAVE FRONT

This application claims the benefit of priority of U.S. Provisional Patent Application No. 62/373,734, filed Aug. 11, 2016, which is incorporated by reference herein in its entirety.

FIELD

The present description relates to an inspection apparatus usable, for example, in the manufacture of devices by a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

A lithographic apparatus can be used, for example, in the manufacture of integrated circuits (ICs) and other devices. In such a case, a patterning device (e.g., a mask) may contain or provide a pattern corresponding to an individual layer of the device ("design layout"), and this pattern can be transferred onto a target portion (e.g. comprising one or more dies) on a substrate (e.g., silicon wafer) that has been coated with a layer of radiation-sensitive material ("resist"), by methods such as irradiating the target portion through the pattern on the patterning device. In general, a single substrate contains a plurality of adjacent target portions to which the pattern is transferred successively by the lithographic apparatus, one target portion at a time. In one type of lithographic apparatuses, the pattern is transferred onto one target portion in one go; such an apparatus is commonly referred to as a wafer stepper. In an alternative apparatus, commonly referred to as a step-and-scan apparatus, a projection beam scans over the patterning device in a given reference direction (the "scanning" direction) while synchronously moving the substrate parallel or anti-parallel to this reference direction. Different portions of the pattern on the patterning device are transferred to one target portion progressively. Since, in general, the lithographic apparatus will have a magnification factor M (generally <1), the speed F at which the substrate is moved will be a factor M times that at which the beam scans the patterning device.

Prior to transferring the pattern from the patterning device to the substrate, the substrate may undergo various procedures, such as priming, resist coating and a soft bake. After exposure, the substrate may be subjected to other procedures, such as a post-exposure bake (PEB), development, a hard bake and measurement/inspection of the transferred pattern. This array of procedures is used as a basis to make an individual layer of a device, e.g., an IC. The substrate may then undergo various processes such as etching, ion-implantation (doping), metallization, oxidation, chemo-mechanical polishing, etc., all intended to finish off the individual layer of the device. If several layers are required in the device, then the whole procedure, or a variant thereof, is repeated for each layer. Eventually, a device will be present in each target portion on the substrate. These devices are then separated from one another by a technique such as dicing or sawing, whence the individual devices can be mounted on a carrier, connected to pins, etc.

As noted, lithography is a central step in the manufacturing of ICs and other devices, where patterns formed on substrates define functional elements of the devices, such as microprocessors, memory chips etc. Similar lithographic techniques are also used in the formation of flat panel displays, micro-electro mechanical systems (MEMS) and other devices.

In a lithographic process (i.e., a process of developing a device or other structure involving lithographic exposure, which may typically include one or more associated processing steps such as development of resist, etching, etc.), it is desirable frequently to make measurements of structures created, e.g., for process control and verification. Various tools for making such measurements are known, including scanning electron microscopes, which are often used to measure critical dimension (CD), and specialized tools to measure overlay, the accuracy of alignment of two layers of a substrate.

SUMMARY

The following is a non-exhaustive listing of some aspects of the present techniques. These and other aspects are described in the following disclosure.

Some aspects provide an optical inspection apparatus, including: an optical metrology tool configured to measure structures patterned on a substrate, the optical metrology tool comprising: an electromagnetic (EM) radiation source configured to direct a beam of EM radiation along an EM radiation path; an adaptive optical system disposed in a portion of the EM radiation path and configured to adjust a shape of a wave front of the beam of EM radiation, the adaptive optical system comprising: a first aspherical optical element; a second aspherical optical element adjacent the first aspherical optical element; and an actuator configured to cause relative movement between the first optical element and the second optical element in a direction different from a beam axis of the portion of the EM radiation path.

Features and/or advantages of embodiments of the invention, as well as the structure and operation of various embodiments of the invention, are described in detail herein with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which.

FIG. 1 is a schematic depicting a lithographic apparatus according to some embodiments;

FIG. 2 is a schematic depicting a lithographic cell or cluster according to some embodiments;

FIG. 3A is a schematic depicting a dark field measurement apparatus for use in measuring targets according to some embodiments using a first pair of illumination apertures providing certain illumination modes;

FIG. 3B is a schematic depicting a diffraction spectrum of a target for a given direction of illumination;

FIG. 3C is a schematic depicting a second pair of illumination apertures providing further illumination modes in using a measurement apparatus for diffraction based overlay measurements;

FIG. 3D is a schematic depicting a third pair of illumination apertures combining the first and second pairs of apertures providing further illumination modes in using a measurement apparatus for diffraction based overlay measurements;

FIG. 4A is a schematic depicting a form of multiple periodic structure (e.g., multiple grating) target and an outline of a measurement spot on a substrate;

FIG. 4B is a schematic depicting an image of the target of FIG. 4A obtained in the apparatus of FIG. 3;

Figure 5A:
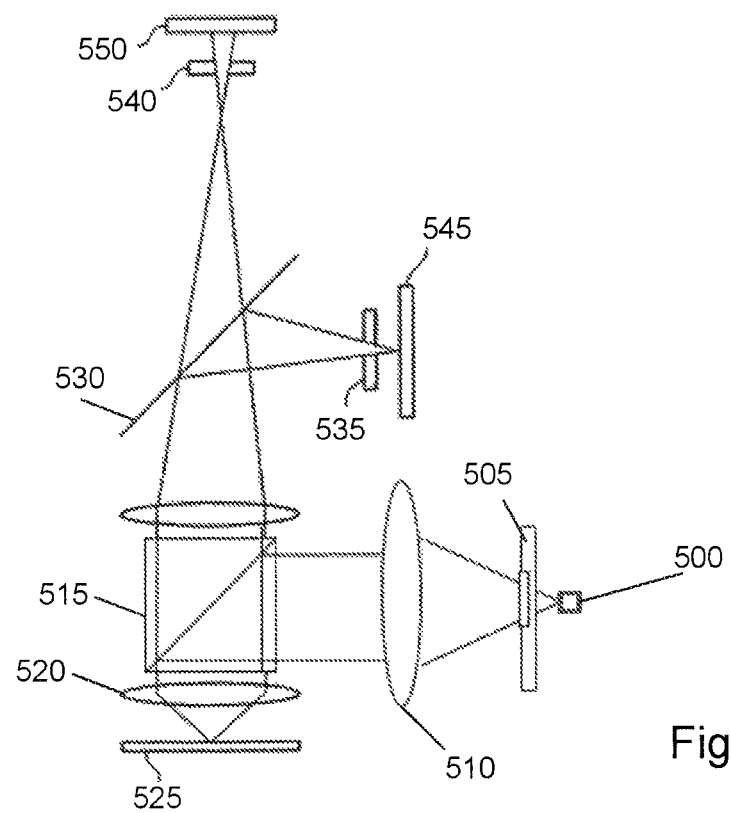
FIG. 5A is a schematic depicting an embodiment of a confocal focus sensor system that can be used in an inspection apparatus.

While the inventions are susceptible to various modifications and alternative forms, specific embodiments thereof are shown by way of example in the drawings and will herein be described in detail. The drawings may not be to scale. It should be understood, however, that the drawings and detailed description thereto are not intended to limit the inventions to the particular forms disclosed, but to the contrary, the intention is to cover all modifications, equivalents, and alternatives falling within the spirit and scope of the present inventions as defined by the appended and later amended claims.

DETAILED DESCRIPTION

To mitigate the problems described herein, the inventors had to both invent solutions and, in some cases just as importantly, recognize problems overlooked (or not yet foreseen) by others in the field of optical metrology and lithographic patterning. Indeed, the inventors wish to emphasize the difficulty of recognizing those problems that are nascent and will become much more apparent in the future should trends in industry continue as the inventors expect. Further, because multiple problems are addressed, it should be understood that some embodiments are problem-specific, and not all embodiments address every problem with traditional systems described herein or provide every benefit described herein. That said, improvements that solve various permutations of these problems are described below.

Often, optical systems adapt various aberrations (e.g., focus and others noted below) of electromagnetic radiation (e.g., light). In many cases, such aberrations are modified to accommodate variation in the dimensions of substrates being measured or drift in process equipment. However, as noted below, these adjustments can be relatively time consuming, reducing equipment throughput and the sample size of measurements used in process characterization.

One cause for delay in adapting a beam of EM radiation is the time taken for optical elements, like lenses and mirrors, to move. Often, adjustments are made by causing one optical element to move closer to another or further from another, along a beam axis. These movements often involve relatively long travel paths that can take time for relatively accurate linear actuators to traverse. This can impose significant delays between measurements and other optical processes.

Some embodiments described below mitigate these delays with an adaptive optical system that is more optically responsive to movement of optical elements than many traditional systems. In some embodiments, the adaptive optical system includes (either instead of or in addition to the components described above) a pair of optical elements that move relative to one another in a direction generally orthogonal to a beam axis. The optical elements, in some embodiments noted below, include complimentary aspheric curved surfaces that cooperate to translate linear movement into changes in various optical aberrations of a beam passing through the optical elements. In contrast with traditional systems, the amount of movement for a given change in many optical aberrations is relatively small, which is expected to result in relatively fast adjustment to the optical system. In some embodiments, adjustments may be achieved within less than 100 microseconds, like less than 10 microseconds, and in many cases as fast as 4 microseconds. That said, not all embodiments provide this benefit, as several independently useful inventions are described, and these inventions may be deployed in pursuit of various other goals subject to engineering and cost tradeoffs.

Examples of the adaptive optical system are described in greater detail with reference to FIGS. 6-17. But before describing such embodiments in detail, it is instructive to present an example environment in which embodiments may be implemented.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular and/or spatial intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. An embodiment of an alignment system, which can detect the alignment markers, is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

A target used by a conventional scatterometer comprises a relatively large periodic structure layout (e.g., comprising one or more gratings), e.g., 40 μm by 40 μm. In that case, the measurement beam often has a spot size that is smaller than the periodic structure layout (i.e., the layout is underfilled such that one or more of the periodic structures is not completely covered by the spot). This simplifies mathematical reconstruction of the target as it can be regarded as infinite. However, for example, so the target can be positioned in among product features, rather than in the scribe lane, the size of a target has been reduced, e.g., to 20 μm by 20 μm or less, or to 10 μm by 10 μm or less. In this situation, the periodic structure layout may be made smaller than the measurement spot (i.e., the periodic structure layout is overfilled). Typically such a target is measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay using dark-field detection of the diffraction orders enables overlay measurements on smaller targets. These targets can be smaller than the illumination spot and may be surrounded by product structures on a substrate. In an embodiment, multiple targets can be measured in one image.

In an embodiment, the target on a substrate may comprise one or more 1-D periodic gratings, which are printed such that after development, the bars are formed of solid resist lines. In an embodiment, the target may comprise one or more 2-D periodic gratings, which are printed such that after development, the one or more gratings are formed of solid resist pillars or vias in the resist. The bars, pillars or vias may alternatively be etched into the substrate. The pattern of the grating is sensitive to chromatic aberrations in the lithographic projection apparatus, particularly the projection system PL, and illumination symmetry and the presence of such aberrations will manifest themselves in a variation in the printed grating. Accordingly, the measured data of the printed gratings can be used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other measurement processes.

A dark field metrology apparatus suitable for use in embodiments is shown in FIG. 3A. A target T (comprising a periodic structure such as a grating) and diffracted rays are illustrated in more detail in FIG. 3B. The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective 16. These lenses are arranged in a double sequence of a 4F arrangement. A different lens arrangement can be used, provided that it still provides a substrate image onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture device 13 of suitable form between lenses 12 and 14, in a plane which is a back-projected image of the objective pupil plane. In the example illustrated, aperture device 13 has different forms, labeled 13N and 13S, allowing different illumination modes to be selected. The illumination system in the present examples forms an off-axis illumination mode. In the first illumination mode, aperture device 13N provides off-axis illumination from a direction designated, for the sake of description only, as 'north'. In a second illumination mode, aperture device 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals.

As shown in FIG. 3B, target T is placed with substrate W substantially normal to the optical axis O of objective 16. A ray of illumination I impinging on target T from an angle off the axis O gives rise to a zeroth order ray (solid line 0) and two first order rays (dot-chain line+1 and double dot-chain line−1). With an overfilled small target T, these rays are just one of many parallel rays covering the area of the substrate including metrology target T and other features. Since the aperture in device 13 has a finite width (necessary to admit a useful quantity of radiation), the incident rays I will in fact occupy a range of angles, and the diffracted rays 0 and +1/−1 will be spread out somewhat. According to the point spread function of a small target, each order+1 and −1 will be further spread over a range of angles, not a single ideal ray as shown. Note that the periodic structure pitch and illumination angle can be designed or adjusted so that the first order rays entering the objective are closely aligned with the central optical axis. The rays illustrated in FIGS. 3A and 3B are shown somewhat off axis, purely to enable them to be more easily distinguished in the diagram.

At least the 0 and +1 orders diffracted by the target on substrate W are collected by objective 16 and directed back through prism 15. Returning to FIG. 3A, both the first and second illumination modes are illustrated, by designating diametrically opposite apertures labeled as north (N) and south (S). When the incident ray I is from the north side of the optical axis, that is when the first illumination mode is applied using aperture device 13N, the +1 diffracted rays, which are labeled+1(N), enter the objective 16. In contrast, when the second illumination mode is applied using aperture device 13S the −1 diffracted rays (labeled−1(S)) are the ones which enter the lens 16. Thus, in an embodiment, measurement results are obtained by measuring the target twice under certain conditions, e.g., after rotating the target or changing the illumination mode or changing the imaging mode to obtain separately the $-1^{st}$ and the $+1^{st}$ diffraction order intensities. Comparing these intensities for a given target provides a measurement of asymmetry in the target, and asymmetry in the target can be used as an indicator of a parameter of a lithography process, e.g., overlay error. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not described in detail here.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image DF of the target formed on sensor 23 is formed from the −1 or +1 first order beam. The images captured by sensors 19 and 23 are output to processor and controller PU, the function of which will depend on the particular type of measurements being performed. Note that the term 'image' is used here in a broad sense. An image of the periodic structure features (e.g., grating lines) as such will not be formed, if only one of the −1 and +1 orders is present.

The particular forms of aperture device 13 and stop 21 shown in FIG. 3 are purely examples. In another embodiment, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture device 13 may comprise a number of aperture patterns formed around a disc, which rotates to bring a desired pattern into place. Note that aperture device 13N or 13S are used to measure a periodic structure of a target oriented in one direction (X or Y depending on the set-up). For measurement of an orthogonal periodic structure, rotation of the target through 90° and 270° might be implemented. Different aperture devices are shown in FIGS. 3C and D. FIG. 3C illustrates two further types of off-axis illumination mode. In a first illumination mode of FIG. 3C, aperture device 13E provides off-axis illumination from a direction designated, for the sake of description only, as 'east' relative to the 'north' previously described. In a second illumination mode of FIG. 3C, aperture device 13W is used to provide similar illumination, but from an opposite direction, labeled 'west'. FIG. 3D illustrates two further types of off-axis illumination mode. In a first illumination mode of FIG. 3D, aperture device 13NW provides off-axis illumination from the directions designated 'north' and 'west' as previously described. In a second illumination mode, aperture device 13SE is used to provide similar illumination, but from an opposite direction, labeled 'south' and 'east' as previously described. The use of these, and numerous other variations and applications of the apparatus are described in, for example, the prior published patent application publications mentioned above.

FIG. 4A depicts an example composite metrology target formed on a substrate. The composite target comprises four periodic structures (in this case, gratings) 32, 33, 34, 35 positioned closely together. In an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 µm×20 µm or within 16 µm×16 µm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs.

Returning to FIG. 4A, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets+d and −d respectively. While four periodic structures are illustrated, another embodiment may include a larger matrix to obtain desired accuracy. For example, a 3×3 array of nine composite periodic structures may have biases−4 d, −3 d, −2 d, −d, 0, +d, +2 d, +3 d, +4 d. Separate images of these periodic structures can be identified in the image captured by sensor 23.

FIG. 4B shows an example of an image that may be formed on and detected by the sensor 23, using the target of FIG. 4A in the apparatus of FIG. 3, using the aperture devices 13NW or 13SE from FIG. 3D. While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. If the periodic structures are located in product areas, product features may also be visible in the periphery of this image field. Processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an example of such a parameter.

The measurement accuracy and/or sensitivity of the target may vary with respect to one or more characteristics of the beam of radiation provided onto the target, for example, the wavelength of the radiation beam, the polarization of the radiation beam, and/or the intensity distribution (i.e., angular or spatial intensity distribution) of the radiation beam. In an embodiment, the wavelength range of the radiation beam is limited to one or more wavelengths selected from a range (e.g., selected from the range of about 400 nm to 900 nm). Further, a selection of different polarizations of the radiation beam may be provided and various illumination shapes can be provided using, for example, a plurality of different apertures.

Further, to obtain accurate measurements (e.g., CD, overlay, etc. measurements), at least the target structure on the substrate should be situated at, or near, the focal plane of an objective of the inspection apparatus (e.g., a metrology apparatus). As discussed above, this can be done by focusing the target structure, whether by changing the focus point of the optical system and/or by providing relative movement between the substrate and the focus point (e.g., by moving the substrate, at least part of the optical system, or both).

In an embodiment, to provide focus control, a focus sensor system with a confocal optical system can be used in an inspection apparatus (e.g., in an overlay and/or CD measurement apparatus) and/or lithographic apparatus. The focus sensor system can generate a focus error signal which can be used as part of a control loop to ensure that the substrate is in focus. An example layout of focus sensor system with a confocal optical system is depicted in FIG. 5A. In the system, radiation is provided by an input 500 (e.g., a radiation source) to an illumination field stop 505. From the stop 505, the radiation passes via a condenser lens 510 to an optical element (e.g., a beam splitter) 515, which directs the beam to an objective 520. The radiation is output from objective 520 to substrate 525. The radiation redirected by the substrate 525 passes via objective 520 and optionally optical element 515 to a beam splitter 530 in the detection branch. A portion of the beam is provided to aperture 535 and another portion is provided to aperture 540. In an embodiment, apertures 535, 540 are pinhole apertures provided, e.g., in respective plates. In an embodiment, one of the apertures 535, 540 is a different distance from the beam splitting surface of the beam splitter 530 than the other aperture 535, 540. Associated with each of the apertures 535, 540 is a respective detector 545, 550 to receive the respective portion of radiation from the respective apertures 535, 540. In an embodiment, the detectors are photo-detectors.

Figure 5B:
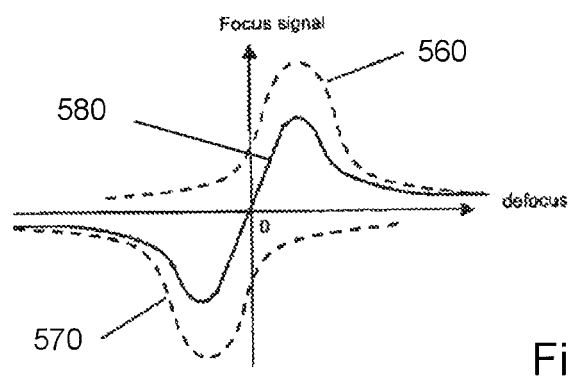
FIG. 5B is a graph depicting focus error signals that can be generated from the sensor system of FIG. 5A.

In an embodiment, the system of FIG. 5A generates a focus error signal for the substrate using a signal 560 from, e.g., the combination of aperture 535 and detector 545, and a signal 570 from, e.g., the combination of aperture 540 and detector 550. In an embodiment, signal 570 is subtracted from signal 560 to produce focus error signal 580 for the substrate as shown in FIG. 5B.

A problem with this arrangement in an inspection apparatus can be that the focus spot (which is for keeping the substrate in focus of the inspection apparatus) can overlap with a measurement spot provided by the inspecting branch of the inspection apparatus (which spot is not shown in FIG. 5) that is used for inspecting or measuring the substrate. This overlap may prevent simultaneous operation of the focusing and inspecting operations/branches. In an embodiment, simultaneous use can be obtained by using spectral separation and interference filters, but this can cause one or more additional limitations, such as the wavelength ranges that can be used for inspection.

Thus, in an embodiment, there is provided an improved focusing apparatus and/or method for an inspection apparatus to, for example, enable improved accuracy and/or sensitivity in measurements and/or enable improved spectral range of operation for an inspection apparatus (e.g., overlay and/or CD measurement apparatus).

Figure 6:
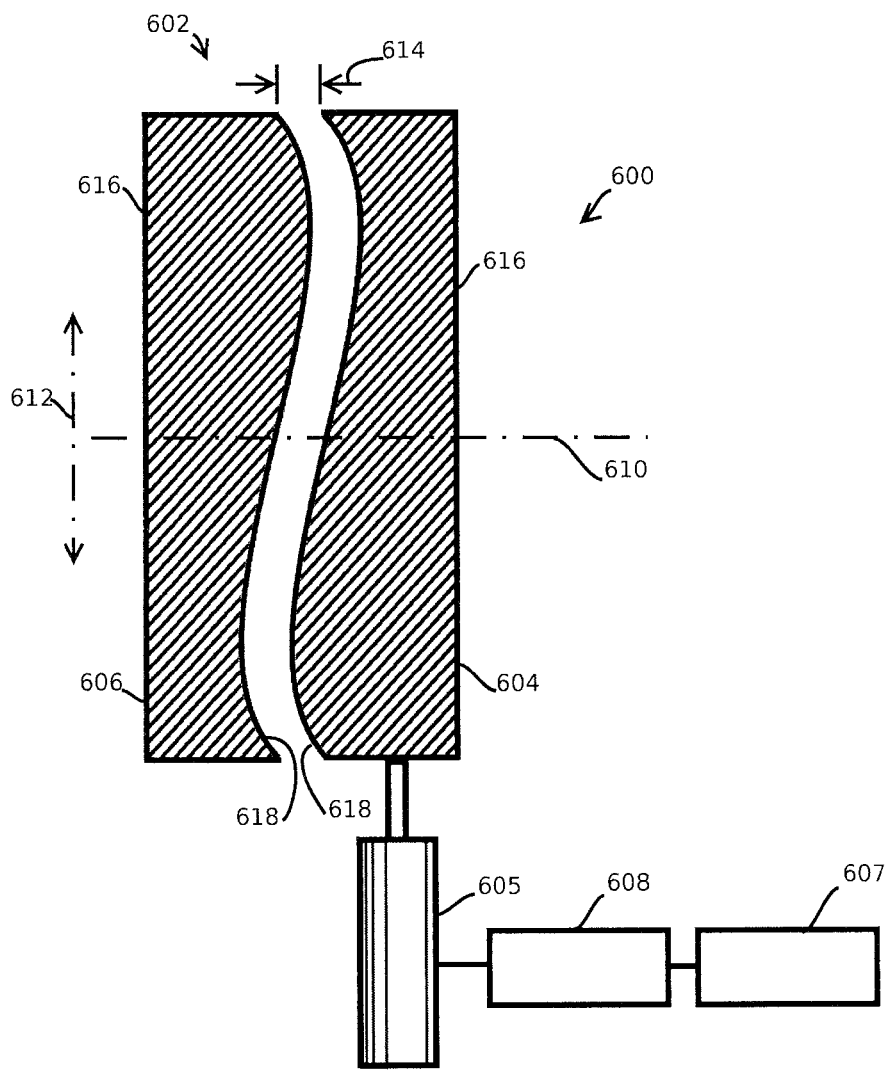
FIG. 6 is a partial cross-sectional elevation view of an adaptive optical system configured to adjust various aberrations in electromagnetic radiation passing through the above-described systems.
Figure 7:
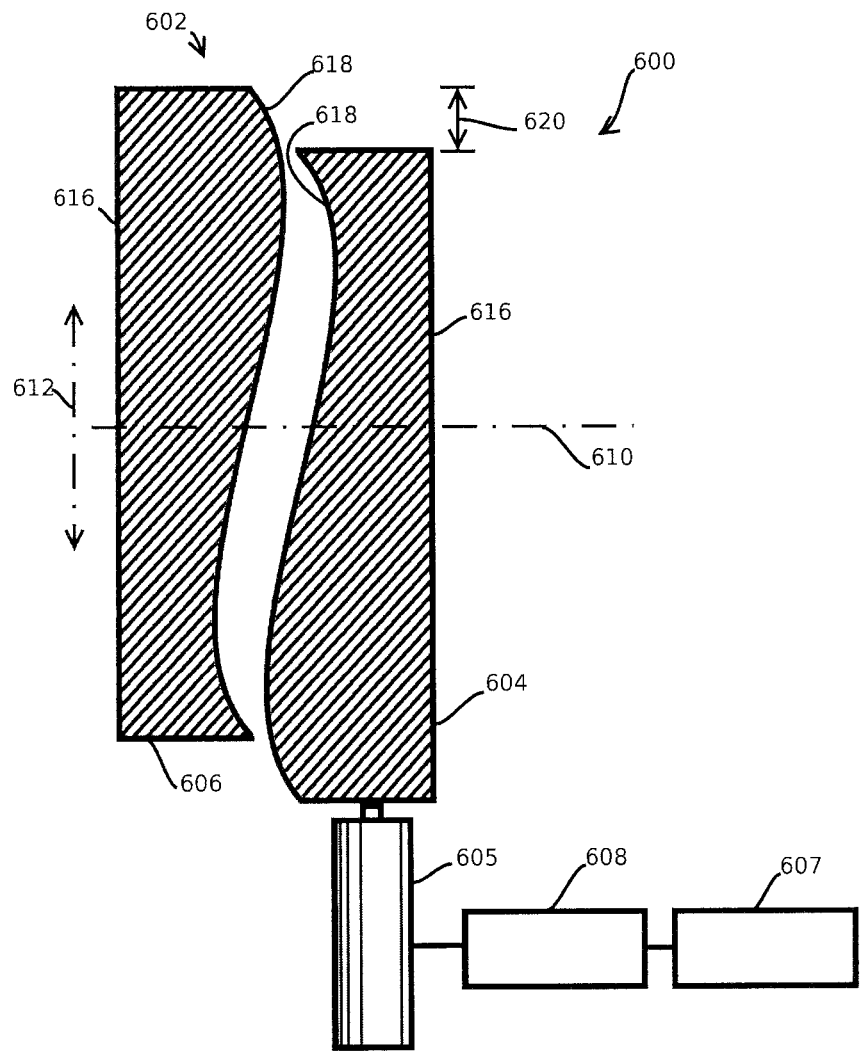
FIG. 7 is a partial cross-sectional elevation view depicting movement of the system of FIG. 6 in a first direction.

FIG. 6 is a partial cross-sectional elevation view of an example of an adaptive optical system 600 suitable for use in the various optical instruments described herein, including the above-described optical metrology tools, like scatterometry tools and the dark-field measurement tools for characterizing patterning processes.

In some embodiments, the adaptive optical system 600 may be configured to control and otherwise modify various aberrations of electromagnetic (EM) radiation, such as electromagnetic radiation passing through the illumination path of the above-described optical instruments. In some embodiments, the EM radiation is light radiation, for instance, collimated light radiation within spectral band of 675-786 nm (or broader, or different ranges) (e.g., more than 80% within this band, like more than 99% within this band).

A variety of different aberrations may be modified with the adaptive optical system 600, depending upon the configuration of various components described below. In some cases, the adaptive optical system 600 may modify such aberrations to accommodate variation in either an optical instrument or a substrate being illuminated with the optical instrument. Examples of such variation include drift in staging equipment, variation in planarity of a substrate, deformation of optical elements through thermal variation, and the like. In some embodiments, the adaptive optical system 600 may adjustably modify chromatic aberrations, monochromatic aberrations, or both, depending upon the configuration.

In some embodiments, the adaptive optical system 600 may be configured to modify various aberrations relatively quickly compared to some traditional techniques. In some embodiments, components of the adaptive optical system may have a relatively high derivative of change in one or more optical aberrations to movement of (e.g., changes in position or orientation) various components. As a result, relatively small, fast movements may relatively quickly introduce desired modifications to various aberrations. As a result, in some cases, real-time adjustments to process variation may be made, yielding relatively high throughput and relatively accurate processing of substrates. It should be noted, though, that not all embodiments of for these benefits, as the various features described herein may be deployed to other ends, and various independently useful inventions are described and each of those inventions may provide different benefits, e.g., the time gained by faster responses may be consumed by additional refinements in adjustments to obtain more accurate measurements in the same time as traditional systems.

In some embodiments, the adaptive optical system 600 includes an optics assembly 602 (shown in a cross-section through a center point normal to both a beam axis 610 and an axis of movement 612), an actuator 605, a sensor 607, and a controller 608. In some embodiments, these components may operate to exercise feedback or feedforward control of various optical aberrations in a beam of electromagnetic radiation passing through the optics assembly 602.

In some embodiments, the optics assembly 602 may include two optical elements 604 and 606. In some embodiments, these optical elements 604 and 606 may have shapes like those described below with reference to FIGS. 9 through 12. In some embodiments, each of the optical elements 604 and 606 may be monolithic bodies of transparent material, such as optical grade glass. In some embodiments, each of the optical elements 604 and 606 may be phase plates configured to adjust a shape of a phase surface of a wave of EM radiation passing through the optical assembly 602. In some embodiments, each of the optical elements 604 and 606 may be lenses having the same shape relative to one another.

The optical elements 604 and 606 may be disposed within the optics assembly 602 in different orientations. For instance, the optical element 606 may be positioned adjacent the optical elements 604 and rotated 180° (e.g., within plus or minus 10 percent of this amount) about a beam axis 610 of a beam of EM radiation passing through the optics assembly 602 and having various aberrations modified by the optics assembly 602. The beam may be a portion of an illumination path, e.g. a segment between various pairs of structures in the illumination paths described above with reference to FIGS. 1-5, including between a substrate and the other up-beam components in the path.

In the illustrated configuration, the optical elements 604 and 606 are aligned with one another, but during operation, optical elements 604 or 606 may move along axis 612 while the other optical element remains stationary (thereby introducing relative movement between the optical elements). In the aligned position (e.g., aligned within 10% of their range of movement, or exactly aligned), the optical elements 606 and 604 may be offset from one another by a distance 614 in the direction of the beam axis 610. In some embodiments, the distance 614 may be on the order of 5 to 100 microns, to keep the gap relatively small while still permitting translation of the optical elements.

Unless indicated otherwise, geometric descriptors (including mathematical descriptors of spatial attributes) should be understood to encompass substantially corresponding structures (e.g., "parallel" encompasses "substantially parallel"), and the modifier "exact" will be used when such variation is not also being referenced (e.g., "exactly parallel"). The scope of substantial correspondence will be self-evident to those of ordinary skill in the art given the use case, but where such scope is not self-evident, a 10% range of variation should be assumed. Further, reference to various structures in one frame of reference, like a particular assignment of X, Y, and Z coordinates, should be understood to encompass translation into other equivalent frames of reference (e.g., switching the X and Y coordinates, along with other attributes like direction of movement to match, or switching between Cartesian and polar coordinates).

In some embodiments, each of the optical elements 604 and 606 may include a planar surface 616 (e.g., a generally planar surface consistent with optical tolerances of the use case) and a curved surface 618. In some embodiments, the curved surface 618 may be a partially non-planar surface (e.g., over more than half of the curved surface 618, and in some cases over entirely or substantially entirely the curved surface 618, which in some cases may also be referred to as a phase modifying surface or an aberration modifying surface). The curved surfaces 618 may be on the opposite side of the optical elements 604 and 606 from the planar surface 618 along the beam axis 610.

In the illustrated orientation, the curved surface 618 of the optical elements 606 is positioned facing the curved surface 618 of the optical elements 604, with the planar surfaces 616 facing outward, but in other embodiments, this orientation may be reversed, e.g., with the planar surfaces 616 facing one another, or with one planar surface 616 facing one of the curved surfaces 618.

In some embodiments, the illustrated position of the optical elements 606 and 604 may be referred to as a neutral position, in which aberrations of a beam of EM radiation on the beam axis 610 are generally or entirely unmodified by the optics assembly 602, or some embodiments may also modify aberrations in the aligned position. Due to the various symmetries described below, and the relative orientation of the optical elements 604 and 606 described above, recessed portions of the curved surface 618 on the optical element 606 may be positioned adjacent extended portions of the curved surface 618 of the optical element 604 (and vice versa), such that the optical elements 604 and 606 maintain the distance 614 over the curved surfaces 618. It should be noted, though, that this consistent spacing in the neutral position is not necessarily present in all embodiments (e.g., as described with reference to FIGS. 16 and 17), which is not to suggest that any other feature described herein may not also be omitted in some cases.

In some embodiments, the optical elements 604 and 606 may be made of optical grade glass having a different refractive index from a surrounding environment of the optical assembly 602, such as air. Examples include NBK7_SCHOTT glass.

In some embodiments, one or both of the optical elements 604 and 606 may be moved by one or more actuators 605. Actuator 605 may be mechanically coupled (e.g., by links with zero degrees of relative freedom) to the optical elements 604, though a variety of other configurations are contemplated, with some being described below. In some embodiments, the actuator 605 may be a Piezo-electric linear actuator. In some cases, the actuator 605 may be configured to cause a linear translation of the optical element 604 in the direction 612, for instance in either of two directions along axis 612. Thus, in some embodiments, the actuator 605 may push or pull the optical element 604 along axis 612, perpendicular to the beam axis 610, and causing movement relative to the optical element 606, as described below. Piezo-electric linear actuators are expected to be relatively fast, responsive, and accurate for relatively small ranges of movement used in many contemplated use cases. But it should be noted that embodiments are consistent with a variety of different other types of actuators, such as other linear actuators, like squiggle motors, comb drives, screw drives, and the like.

In some embodiments, the sensor 607 may be one of the above-describe sensors operative to sense various attributes of a beam of EM radiation, for instance, focus relative to a portion of the surface of a substrate being measured. In some embodiments, the sensor 607 is operative to sense focus relative to a surface of the substrate and emit a signal indicative of an amount of lack of focus (or other aberration needing adjustment), in some cases a direction in which focus is lacking, or other signal indicative of a magnitude and direction of various other aberrations. In some embodiments, the adaptive optical system 600 may include multiple sensors configured to sense different aberrations in EM radiation impinging upon a substrate or so directed.

In some embodiments, the sensor 607 may be communicatively coupled to a controller 608 operative to drive the actuator 605 in response to measurements from the sensor 607. The controller 608 may include a model by which deltas from a target aberration are translated into movement signals for the actuator 605. For instance, some embodiments may be configured to receive a signal indicative of an amount by which EM radiation is out of focus, and the controller 608 may signal the actuator 605 adjust a position of the optical element 604 to reduce or eliminate the lack of focus. In some embodiments, the sensor 607 may output a signal that is a binary signal indicative of whether a target condition is met, and the controller 608 may direct the actuator 605 through a range of motion until a change in the Boolean signal occurs, indicating an adequate condition for performing a measurement. In some embodiments, the controller 608 is a microcontroller, or in some embodiments, the controller 608 may be integrated with the various other control systems described above.

An optical instrument, like a YieldStar metrology tool available from ASML, may include the presently described adaptive optical systems. In an example of operation, the tool may ingest a new substrate or navigates to a new measurement location on a previously loaded and aligned substrate. Before movement, in the illustrated configuration of FIG. 6, a wave front of the EM radiation may be relatively undisturbed, for instance, more than 90% undisturbed, by the optics assembly 602, as the effects of the surface 618 on element 606 and element 604 may cancel one another.

However, the sensor 607 may indicate to the controller 608 that a target condition is not been met, for instance that the EM radiation impinging upon the surface of the substrate is out of focus, and the controller 608 may direct various movements of the optical element 604 via the actuator 605. This is shown, by way of example, in FIG. 7. In this example, the actuator 605 has pulled optical elements 604 along the axis 612 through a range of motion 620. In some embodiments, the optical elements 606 may be held stationary relative to the rest of the optical instrument, for instance by being generally a fixed with an immovable amount. As a result, the curved surfaces 618 of optical elements 604 and 606 are no longer aligned and no longer cancel one another. Light passing along the optical axis 610, or other EM radiation, may be modified by the optics assembly 602, for instance, by pushing a focal point further from the optics assembly 602 in the illustrated translation. In some embodiments, various other aberrations may be modified as described in greater detail below as a result of this translation, depending on the shape of curved surface 618.

Of note, the movement 620 is over a relatively small distance and can be accomplished relatively quickly with the actuator 605 as compared to many traditional techniques in which an optical element is translated along the beam axis 610. For instance, some traditional systems may translate an optical element over 20 mm along the beam axis to impose a modification to the beam that some embodiments achieve with less than 2 mm of translation. The amplitude of the curvature of the curves surface 618 may be increased or decreased to adjust the optical sensitivity to such movements in some embodiments.

In some cases, this traditional approach may be combined with the presently described embodiments. For instance, coarse adjustments may be made with translation of the illustrated optical elements orthogonal to the beam axis 610, and higher resolution adjustments may be made by translating another optical element (over a shorter distance than in traditional systems) along the beam axis 610.

Figure 8:
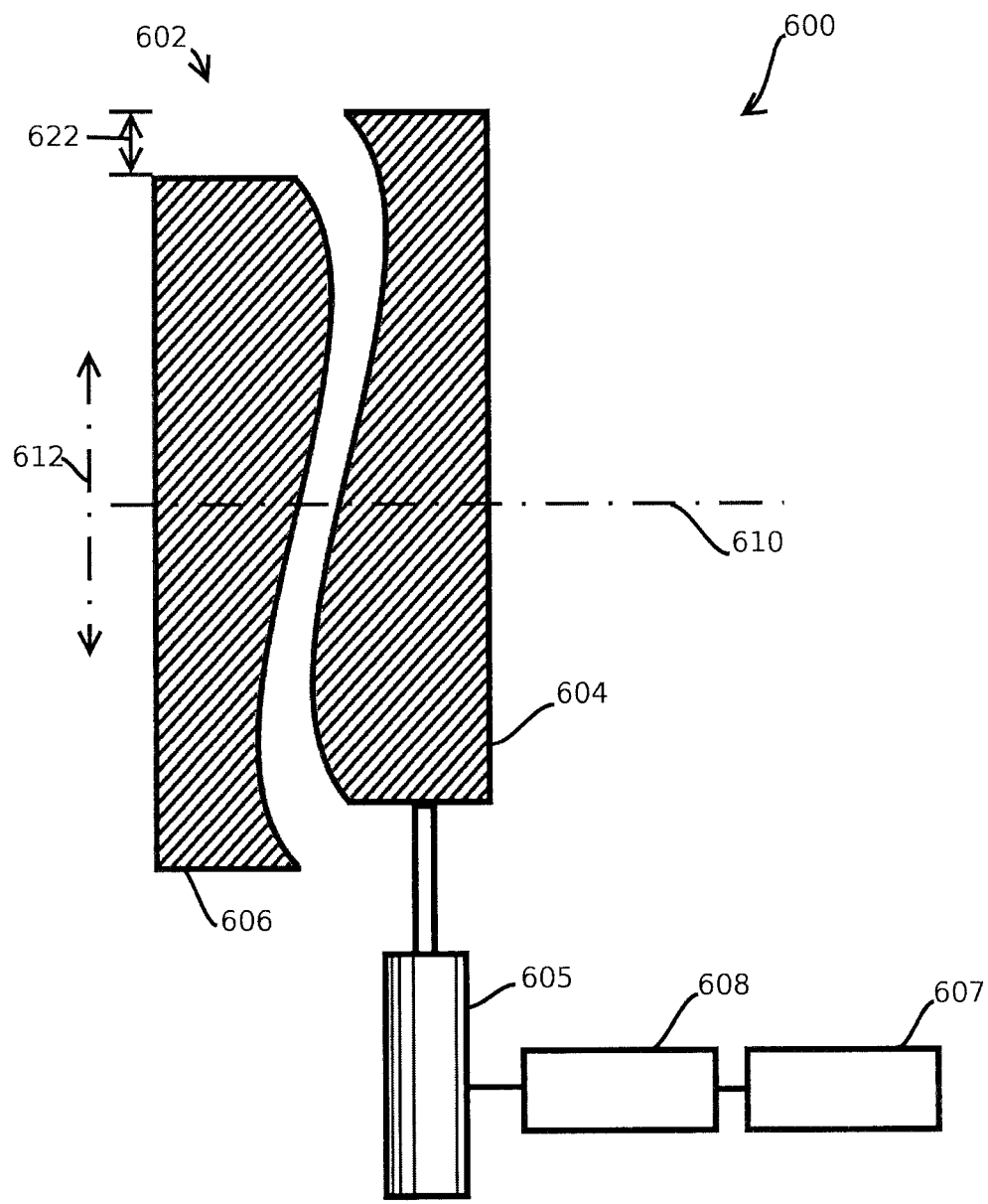
FIG. 8 is a partial cross-sectional elevation view depicting movement of the system of FIG. 6 in a second direction.

FIG. 8 shows movement in the other direction along axis 612 relative to the position of FIG. 6, through a range of movement 622. In some cases, the ranges of movement 622 and 620 combined may constitute a total range of movement of the optical element 604 relative to optical elements 606. In some embodiments, the total range of movement may be less than 10 mm and greater than 0.4 mm. The change in some optical aberrations caused by the movement from the configuration of FIG. 6 to the configuration of FIG. 7 may be reversed in the movement from the configuration of FIG. 6 to the configuration of FIG. 8. In some cases, these changes may be proportionate or may be nonlinear, examples of both being described below, depending upon the shape of the optical elements 604 and 606 and how movement is achieved (e.g., whether both optical elements move or just one moves). Further, it should be noted that the actuator 605 may be configured to move the optical elements 604 to any intermediate position between those shown in FIGS. 7 and 8.

Figure 9:
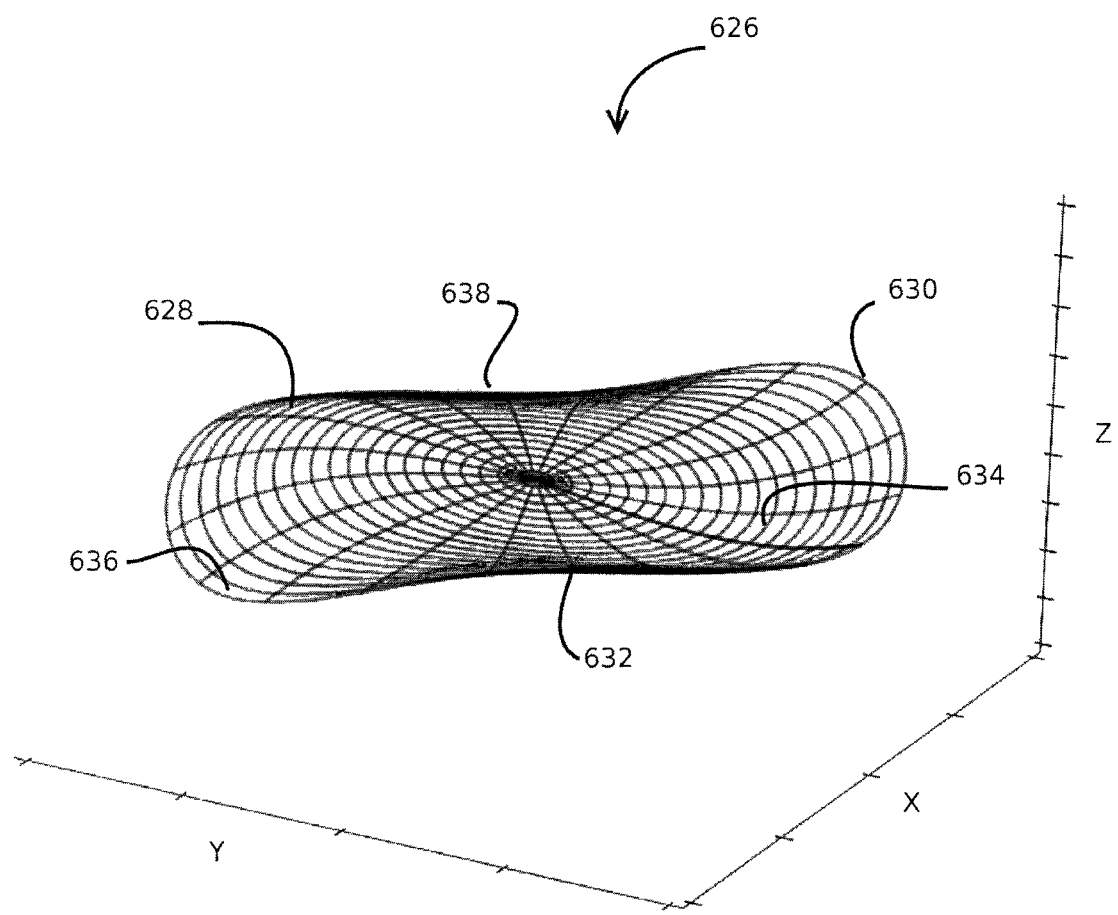
FIG. 9 is a perspective view of a three-dimensional wire-frame plot of a surface of optical elements in some embodiments of the system of FIG. 6.
Figure 10:
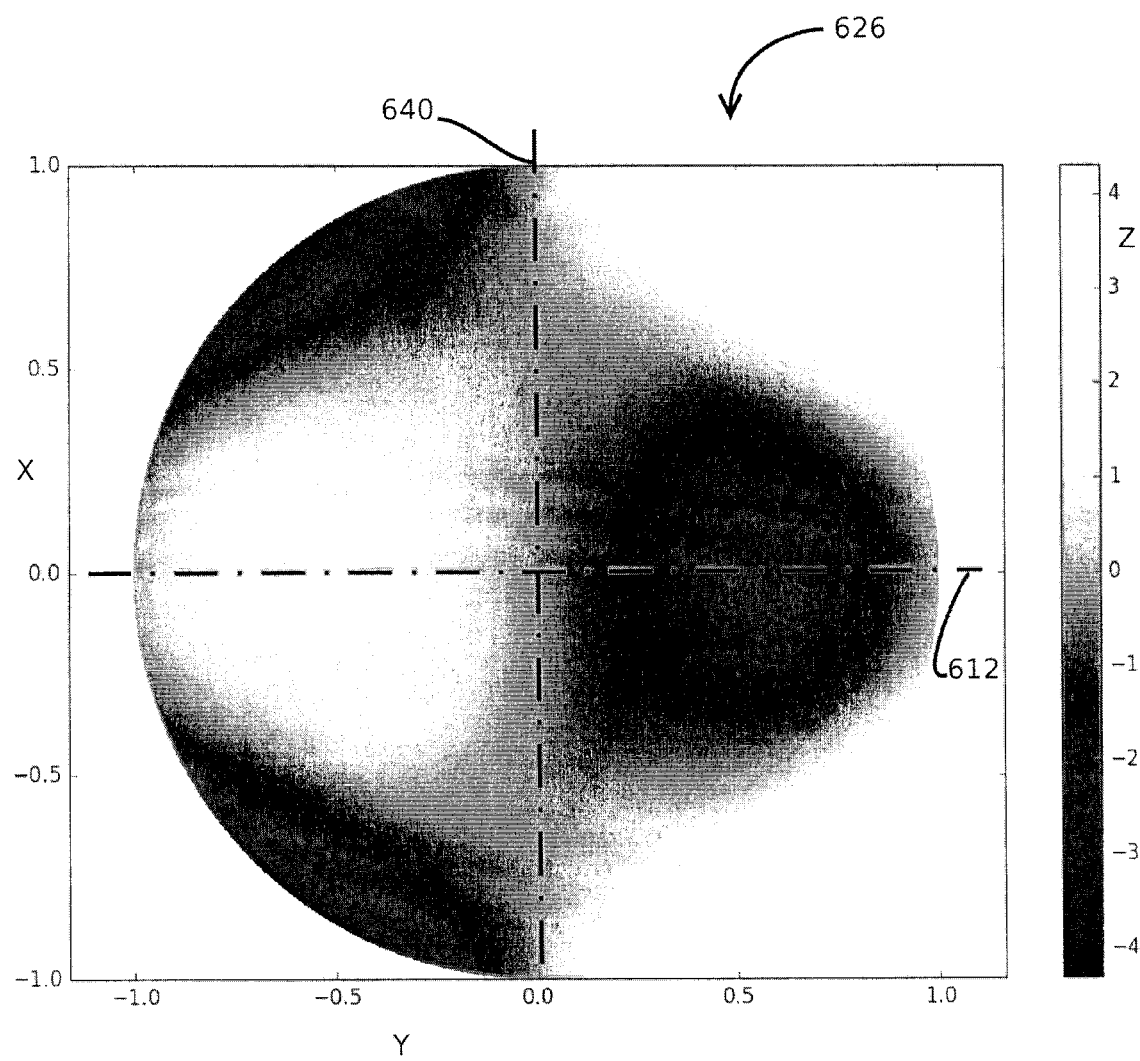
FIG. 10 is a grey-scale topographical map of the surface of FIG. 9.

FIGS. 9 and 10 show an embodiment surface 626 of the curved surface 618 described above. FIG. 9 is a three-dimensional perspective wire plot of the surface, with deviation of the surface 626 along the z-axis corresponding to deviation of the surface 618 the optical axis 610 in FIGS. 6 through 8, and the y-axis corresponding to the axis 612 along which the optical elements 604 or 606 move in FIG. 6 through 8. The x-axis of FIGS. 9 and 10 may be normal to the cross-sectional plane of FIGS. 6 through 8 (and axes 610 and 612).

As illustrated in FIGS. 9 and 10, in some embodiments, the optical elements may have a generally circular shape with the surface 626. For instance, in some embodiments, the optical elements 604 and 606 may be right circular cylinders having a planar base and an opposing surface 626 corresponding to the surface shown in FIGS. 9 and 10.

As shown in FIG. 9, this embodiment of the surface 626 may have a complex curved surface, for instance, with less than 20% of the surface being normal to the z-axis. In this example, the surface 626 may include three local maxima 628, 630, and 632. And three local minima 634, 636, and 638. The surface 626 may have compound curves that vary in both the x and y direction.

The adaptive optical systems described herein may be disposed at various locations in an EM radiation path of an optical metrology tool or other optical system, e.g., a lithographic patterning device. In some embodiments, the adaptive optical system may be disposed in the focus sensing branch of radiation passing through such a system. For instance, the adaptive optical system may be placed in the region in which the focus beam is collimated. Alternatively or additionally, some embodiments may include the adaptive optical system in the illumination branch of the larger optical system in which the adaptive optical system is disposed.

FIG. 10 shows in topographical heat map form the amount of deviation of surface 626 from a plane parallel to planar surfaces 616 of optical elements 604 and 606 along axis 610. In some cases, this may be characterized as an amount of sag or an amount of material machined away from one side of a top right circular cylinder of glass. In this view, the lighter the grayscale, the further the surface is from the planar surface 616 of optical elements 606 or 604 along axis 610 (or the z direction).

As shown in the view of FIG. 10, the surface 626 exhibits various symmetries. The surface 626 may be generally reflectively symmetric about the axis 612 along which the optical element 604 or 606 moves (or the y axis). Further, the surface 626 may be rotationally symmetric about axis 640, extending parallel to the x-axis and intersecting axis 612 at the center of the circle formed by the surface 626. As a result of this rotational symmetry, cutting the surface 626 along the axis 640 and rotating one half of the surface 626 about the axis 640 by 180° should cause the two surfaces to meet and make contact over the entirety of the surface 626. As a result, when the two optical elements 604 and 606 are oriented facing one another and rotated 180° relative to one another about the axis 610 in FIG. 6 through eight, the surfaces should have a constant distance between themselves 614 over the entire surface 626, in this embodiment.

In some embodiments, the surface 626 may be characterized mathematically by a linear combination (e.g., a sum) of a series of Zernike polynomials each having a respective Zernike coefficient corresponding to a contribution of the respective polynomial to defining the surface. Zernike polynomials are 37 polynomials with respective coefficients that can be combined to describe various surfaces over the unit circle. In some embodiments, the surface of FIGS. 9 and 10 may corresponds to a linear combination of Zernike polynomials in which the ninth and 10th Zernike coefficients are equal to one another and the other 35 Zernike coefficients are equal to zero.

The shape of the surface 626 (and other surfaces noted below) is described by the following equation in which the 37. Zernike polynomials are combined (in some cases, with some of the Zernike coefficients having a value of zero causing the respective Zernike polynomial to drop out):

$$z = \frac{cr^2}{1 + \sqrt{1 - (1+k)c^2 r^2}} + \sum_{j=1}^{37} Z_j P_j$$

where:
z is the sag of the surface parallel to the z-axis,
c=1/R is the vertex curvature, $$r = \sqrt{\left(\frac{x}{R_n}\right)^2 + \left(\frac{y}{R_n}\right)^2}$$

k is the conic constant,
x, y are surface coordinates,
Rn is the normalization radius,
Pj is the j-th FRINGE Zernike polynomial, and
Zj is the j-th Zernike coefficient.

The values of coefficients define the corresponding surface and optical properties afforded by that surface. Further, each of the Zernike polynomials may correspond to a particular type of aberration, e.g., the third Zernike polynomial (having the Z3 coefficient) corresponds to tilt and the fourth Zernike polynomial (having the Z4 coefficient) corresponds to focus, with the coefficient indicating the amount of aberration present. In some embodiments, the surface 626 may be one in which the coma and trefoil Zernike coefficients have equal magnitude (e.g., Z7=Z9 !=0; or Z8=−Z10 !=0), and other Zernike coefficients are equal to zero (e.g., are substantially equal to zero or are within 10% of zero relative to the largest absolute value of another Zernike coefficient). In some cases, the surfaces may be the ones of Alvarez lenses.

One advantage of this surface 626 of FIGS. 9 and 10 is that certain aberrations relevant to many optical instruments can be controlled without excessively modifying other aberrations. Depending upon the shape of the optical elements, certain aberrations may be modified, while changes to other aberrations may be relatively small or avoided. In the example of FIGS. 9 and 10, relative movement along axis 612 may adjust focus of EM radiation (i.e., the Z4 Zernike coefficient of the beam), while causing relatively small changes in the tilt of the beam (i.e., the Z3 Zernike coefficient of the beam) and leaving other aberrations relatively or fully unmodified (i.e., the Z1-Z2 and Z5-Z37 Zernike coefficients of the beam).

Figure 11:
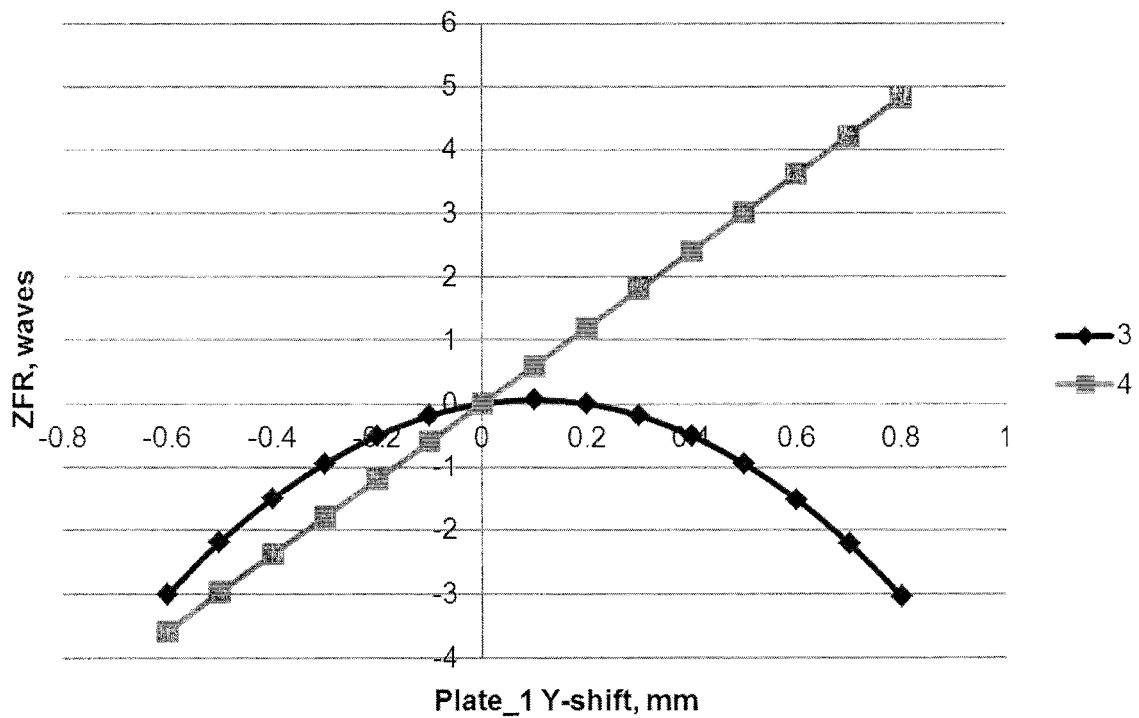
FIG. 11 is a graph depicting correlations between movement of one of the optical elements in the system of FIG. 6 and tilt (the Z3 Zernike coefficient) and focus (the Z4 Zernike coefficient) changes imposed upon electromagnetic radiation passing through some embodiments of the system of FIG. 6.

This relationship between beam aberration changes and movement of the optical elements is illustrated in the graph of FIG. 11. The Z4 Zernike coefficient (i.e., focus) of the beam is represented as Z4, and the Z3 Zernike coefficient (tilt) is represented as Z3. FIG. 11 shows the effect of translation of the optical element 604 along the axis 612, in the Y direction, relative to the optical element 606, on the Z3 and Z4 coefficients of EM radiation passing through the optical assembly 602. As shown, linear translation of one of the optical elements adjust the focus of the beam, while at the same time imposing relatively small changes in the tilt of the beam. In this example, the change in focus is proportionate to the change in translation (making control thereof relatively precise relative to non-linear relationships—though embodiments are also consistent with non-linear controls), while the change in tilt generally follows a parabolic shape. In some embodiments, the amount of change in tilt may be within the tolerances of the optical instrument, and further modifications to the beam may be unnecessary.

Figure 12:
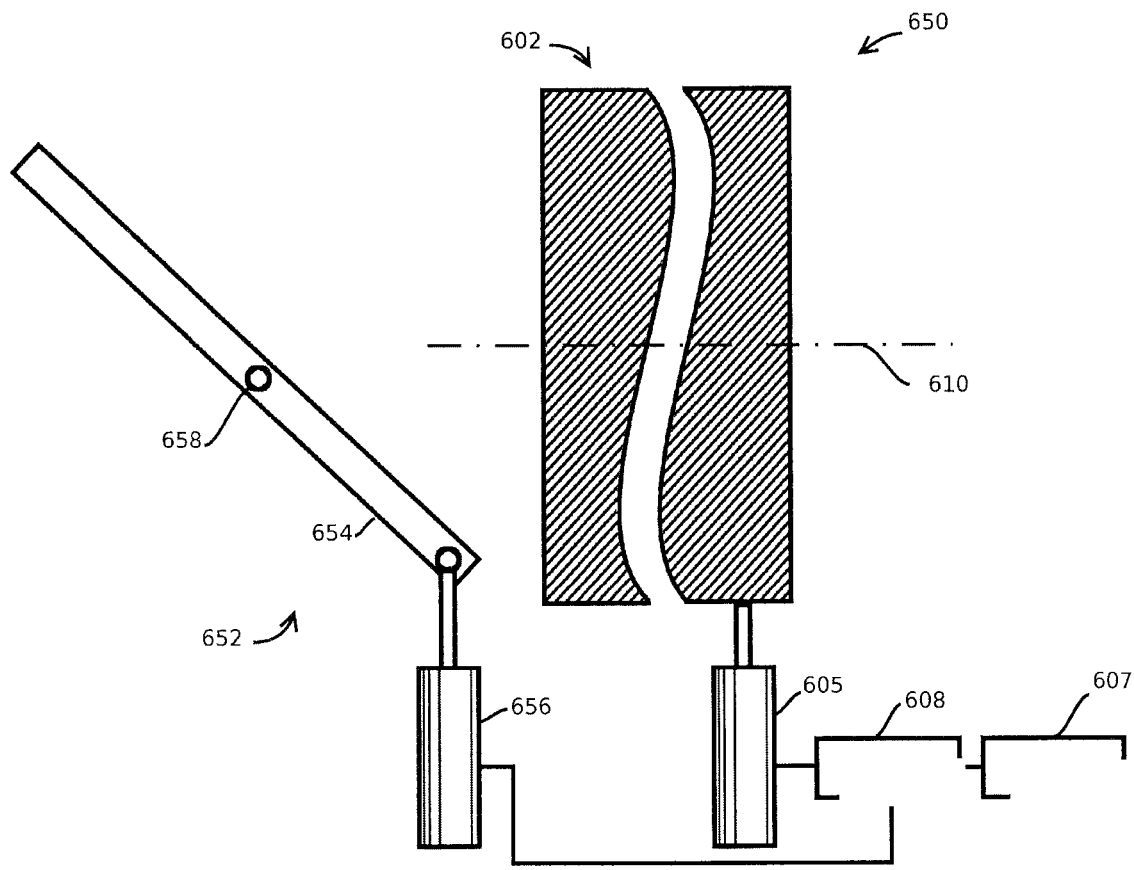
FIG. 12 is a partial cross-sectional elevation view of an adaptive optical system configured to mitigate changes in tilt while adjusting other aberrations.

In other embodiments, additional components may control the Z3 coefficient to counteract the effect of the Z4 adjustments with the apparatus described above. For example, FIG. 12 shows an adaptive optical system 650 having the components described with reference to FIGS. 6 through 11, along with a tilt adjuster 652. In this example, the tilt adjuster 652 includes a mirror 654, a mirror actuator 656, and a pivot 658. In some embodiments, the actuator 656 may couple mechanically to the mirror 654 and drive rotation of the mirror 654 about the pivot 658 to counteract tilt caused by focus adjustments. In some embodiments, the controller 608 may drive both the actuator 605 and the actuator 656. In some embodiments, the controller 608 may execute a routine that causes the actuator 656 to adjust the tilt of the mirror 654 to counteract the parabolic changes in the Z3 coefficient shown in FIG. 11. In some embodiments, the angle of the mirror 654 may be changed in the same direction when deviating from the neutral position but by differing amounts for a given amount of deviation by actuator 605, according to the parabolic changes in Z3 shown in FIG. 11. In some embodiments, the controller 608 may maintain a lookup table that maps linear translation by the actuator 605 to a corresponding translation by the actuator 656 configured to counteract a resulting tilt aberration introduced into a beam of EM radiation. Various mechanisms may be used to tilt the mirror. In some cases, the pin connecting to the mirror may reside in a slot along which it slides, or various other drives may be used.

Figure 13:
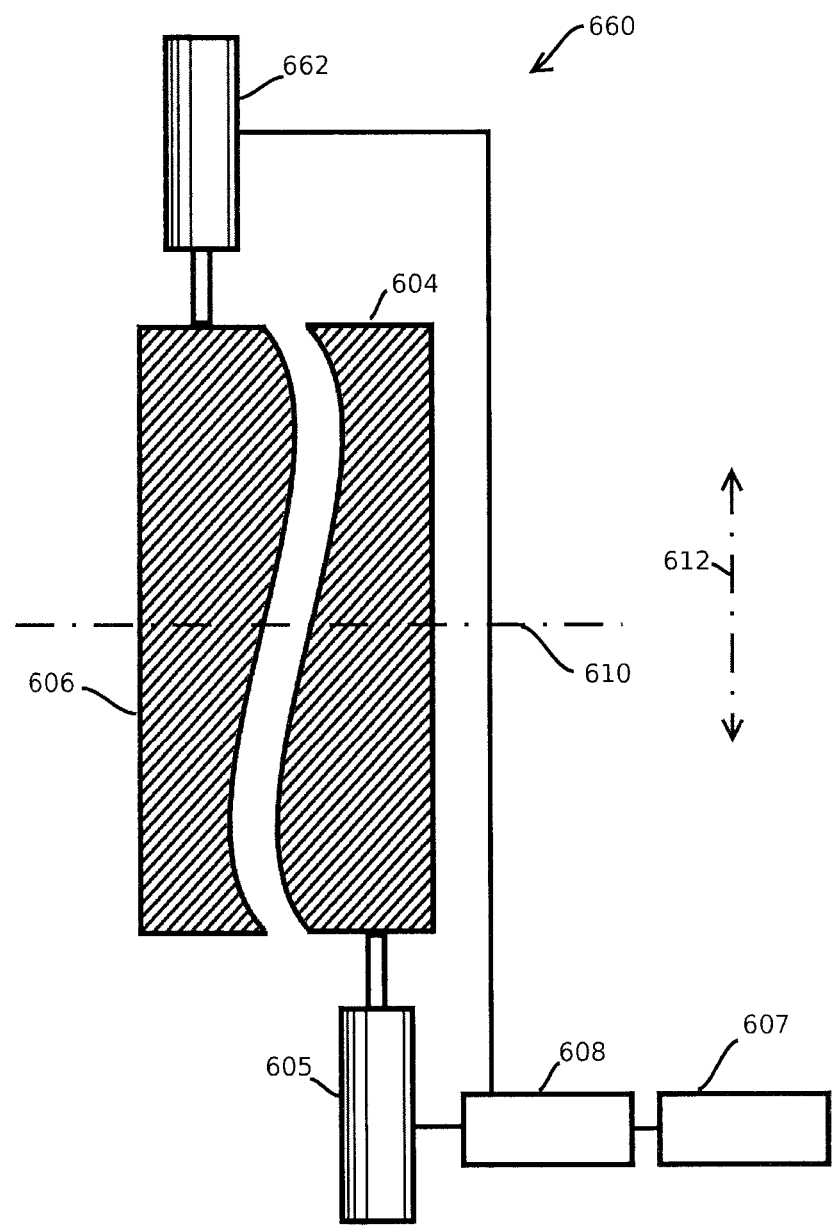
FIG. 13 is a partial cross-sectional elevation view of an adaptive optical system in which two optical elements translate orthogonal to a beam axis with a single degree of freedom between the two optical elements.

FIG. 13 shows another adaptive optical system 660 having the components of the systems described above with reference to FIGS. 6 through 11 along with a secondary actuator 662. In some embodiments, the controller 608 may be configured to drive both of the actuator 605 and 662 by equal amounts, thereby causing both optical elements 606 and 604 to translate linearly along the axis 612 and relative to one another. In some embodiments, movement of both optical elements 606 and 604 may be achieved by a single actuator with a mechanical linkage coupling both optical elements, such as by a rocker bar extending between the optical elements 604 and 606 configured to pivot about a point between the optical elements 604 and 606. In some embodiments, in this configuration, the optical elements 604 and 606 may have one and only one degree of freedom relative to one another as controlled by the controller 608, Or in some embodiments, the actuator 605 and 662 may be operated at an offset position with otherwise equal movements, with the offset position being set according to a calibration routine, for instance, to calibrate tilt and then otherwise control tilt.

Figure 14:
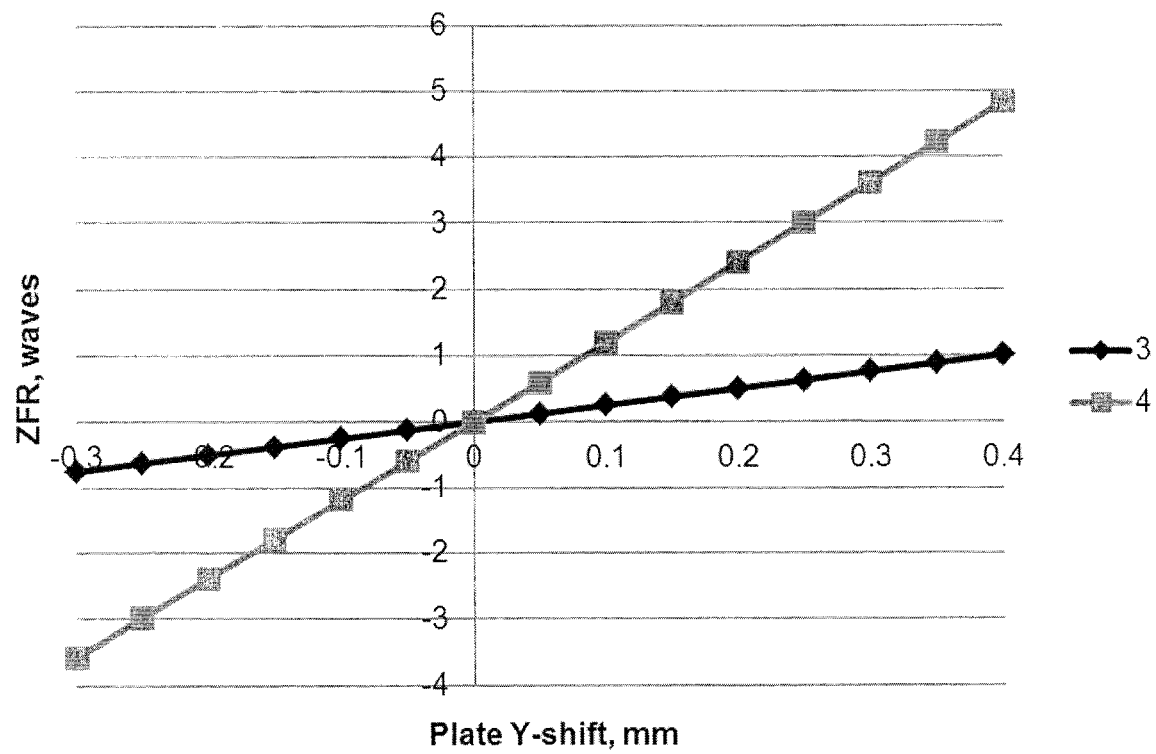
FIG. 14 is a graph depicting correlations between movement of both of the optical elements in the system of FIG. 13 and tilt (the Z3 Zernike coefficient) and focus (the Z4 Zernike coefficient) changes imposed upon electromagnetic radiation passing through some embodiments of the system of FIG. 13.

In some embodiments, the configuration of FIG. 13 is expected to reduce variation in certain non-targeted optical aberrations, like tilt, in some cases making the need for additional control devices, like those described with reference to FIG. 12 unnecessary in some cases (which is not to imply that other features are necessary in all embodiments). Or in some embodiments, the relationship between various optical aberrations may be simplified as a proportionate relationship, such that control algorithms for those other adaptive components may be simplified. An example of this phenomenon is shown in FIG. 14, which illustrates the changes in the Z3 and Z4 Zernike coefficients, corresponding to tilt and focus respectively, of changes to a wave front of EM radiation upon passing through the adaptive optical system 660 relative to equal and opposing movement of the optical elements 606 and 604. As illustrated, when moving both of these optical elements 604 and 606, the tilt, or coefficient Z3, may be proportionate to the amount of translation of each of the optical elements 604 and 606 relative to one another, thereby simplifying adjustments to a down-beam tiltable-mirror's control routine. Further, the total amount of tilt changed is less than that shown in FIG. 11, thereby potentially rendering supplemental adjustments unneeded, which is not to imply that any other feature may not also be omitted in some embodiments.

Figure 15:
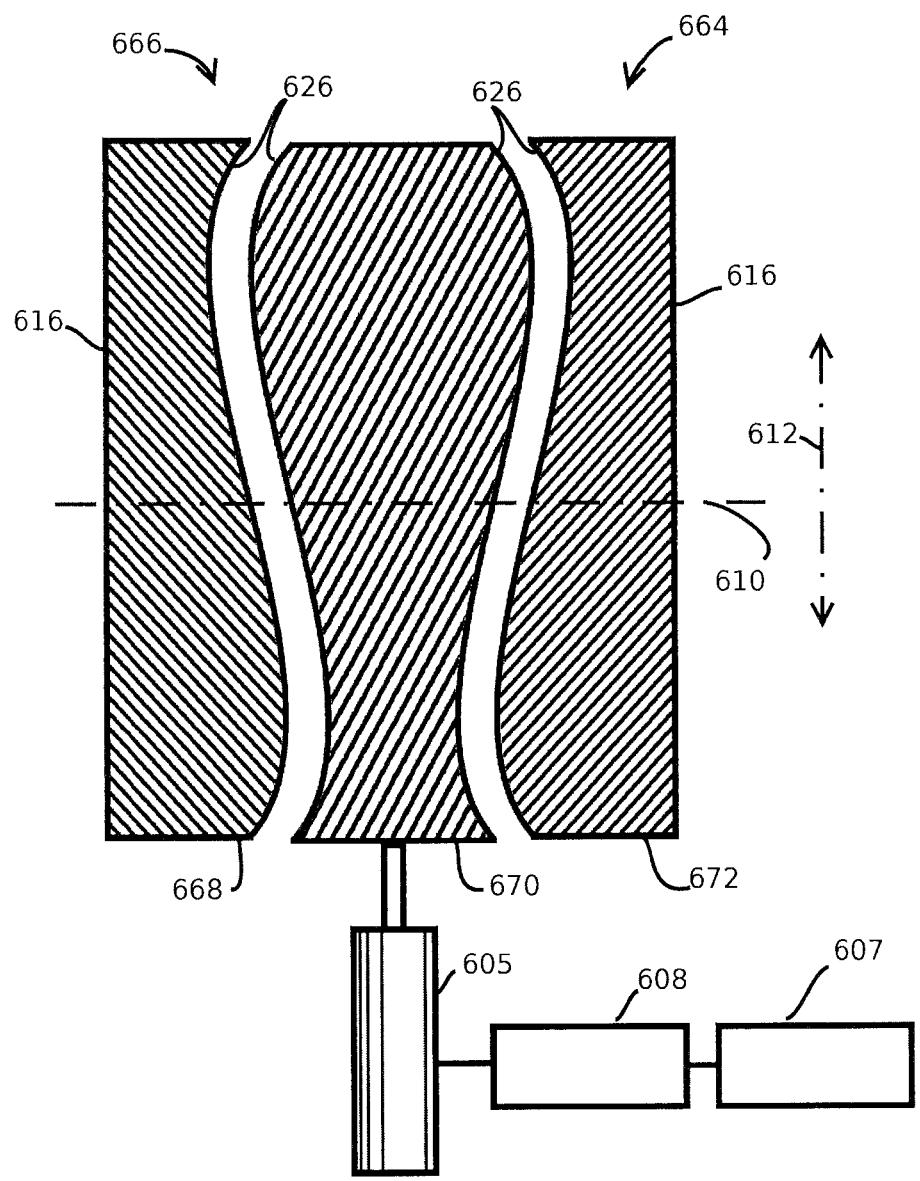
FIG. 15 is a partial cross-sectional elevation view of an adaptive optical system in one optical element having two curved surfaces translates orthogonal to a beam axis between two optical elements.

FIG. 15 shows another example of an adaptive optical system 664 configured to control one or more optical aberrations while mitigating changes in other optical aberrations. In this example, the adaptive optical system 664 includes the components described above with reference to FIGS. 6 through 11, except that the optical assembly 666 is different in this embodiment. This example includes three optical elements 668, 670, and 672. The optical elements 668 and 672 may be generally identical to those described above with reference to FIGS. 6 through 11, though in this example, the optical element 668 and 672 are facing one another and have the same rotational orientation about the axis 610. This embodiment further includes optical element 670, which may have a complementary surface (on both sides) the optical elements 668 and 672. Each depicted curved surface may have the profile described above with reference to FIGS. 9 and 10. In some embodiments, the optical elements 668 and 672 may remain generally static, while the optical element 670 is translated linearly by actuator 605 to adjust focus (or vice versa, or sets both may move, as is shown 13, with elements 668 and 672 moving in tandem). In this example, changes to tilt introduced by the interaction of optical elements 670 and 672 may be undone by the interaction of optical elements 668 and 670, while all three optical element 668, 670, and 672 may adjust focus through additive changes, thereby isolating changes in one aberration without introducing changes in other aberrations.

In some embodiments it may be desirable to vary multiple aberrations simultaneously. For example, some embodiments may modify both the Z4 and the Z9 Zernike components of a wave front of EM radiation. In these embodiments, the optical elements described above may include the surface shown in FIGS. 16 and 17, which are graphical representations in the style of FIGS. 9 and 10. In these examples, linear translation of one of the optical elements may change both the Z4 and the Z9 terms of a Zernike polynomial series describing adjustments to a wave front of electromagnetic radiation passing through the optical assemblies described above. In some embodiments, relatively few changes, or relatively small may be introduced in other Zernike polynomial coefficients. In some embodiments, only the Z3, Z4, and Z9 coefficients of a wave front are changed by a linear translation of optical elements having the surfaces shown in FIGS. 16 and 17, which is another embodiment of the curved surface 618 described above.

In some embodiments, the surfaces may be described by the Zernike series described above, with the coefficients below. In some cases, the Zernike coefficients may include nonzero coefficients for Zernike polynomials having polynomial orders greater than three, for instance fourth, fifth, and higher order polynomials. In some embodiments, these Zernike polynomials coefficients may be normalized relative to the largest polynomial coefficient to characterize the illustrated surface.

TABLE 1

| Coef. | Value |
| --- | --- |
| $R_n$ | 2.5000000E+00 |
| k | 0 |
| Z1 | 0 |
| Z2 | 0 |
| Z3 | 0 |
| Z4 | 6.8303944E−04 |
| Z5 | −1.3541086E−03 |
| Z6 | 0 |
| Z7 | 0 |
| Z8 | 1.1344105E−02 |
| Z9 | 9.8885038E−05 |
| Z10 | 0 |
| Z11 | 1.1344375E−02 |
| Z12 | 2.0142056E−04 |
| Z13 | 0 |
| Z14 | 0 |
| Z15 | −5.4028000E−06 |
| Z16 | −4.2450382E−07 |
| Z17 | 2.0381880E−04 |
| Z18 | 0 |
| Z19 | 0 |
| Z20 | −5.4328215E−06 |
| Z21 | −6.3785986E−07 |
| Z22 | 0 |
| Z23 | 0 |
| Z24 | −1.3605899E−07 |
| Z25 | −3.7873762E−09 |
| Z26 | 0 |
| Z27 | 4.5325371E−06 |
| Z28 | −3.4690633E−07 |
| Z29 | 0 |
| Z30 | 0 |
| Z31 | −1.4186420E−07 |
| Z32 | −4.4223497E−09 |
| Z33 | 0 |
| Z34 | 0 |
| Z35 | 2.5437048E−10 |
| Z36 | −2.0345298E−10 |
| Z37 | 3.0640812E−11 |

In some embodiments, the Zernike coefficients shown above may be adjusted by a scaling factor. In some embodiments, the scaling factor may proportionately modify the derivative of the change in one or more aberrations relative to changes in linear translation of optical elements. Thus, the system may be made more sensitive by increasing the Zernike coefficients proportionately.

Figure 16:
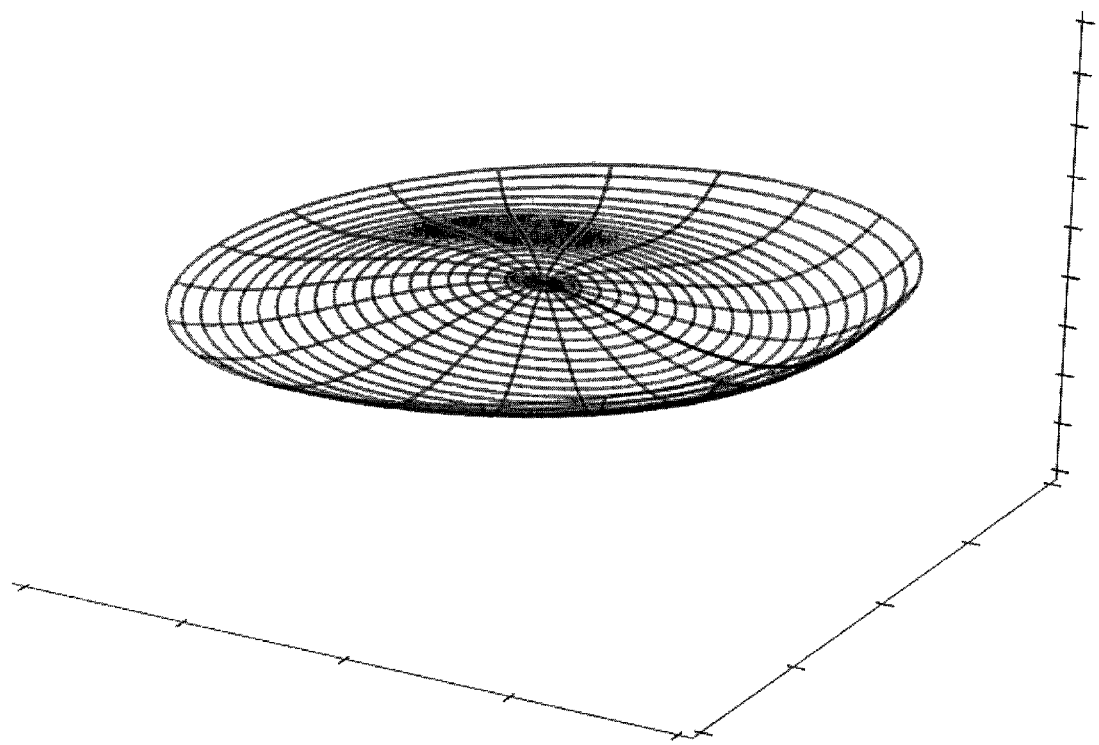
FIG. 16 is a perspective view of a three-dimensional wire-frame plot of a surface of optical elements in some embodiments of the system of FIG. 6.
Figure 17:
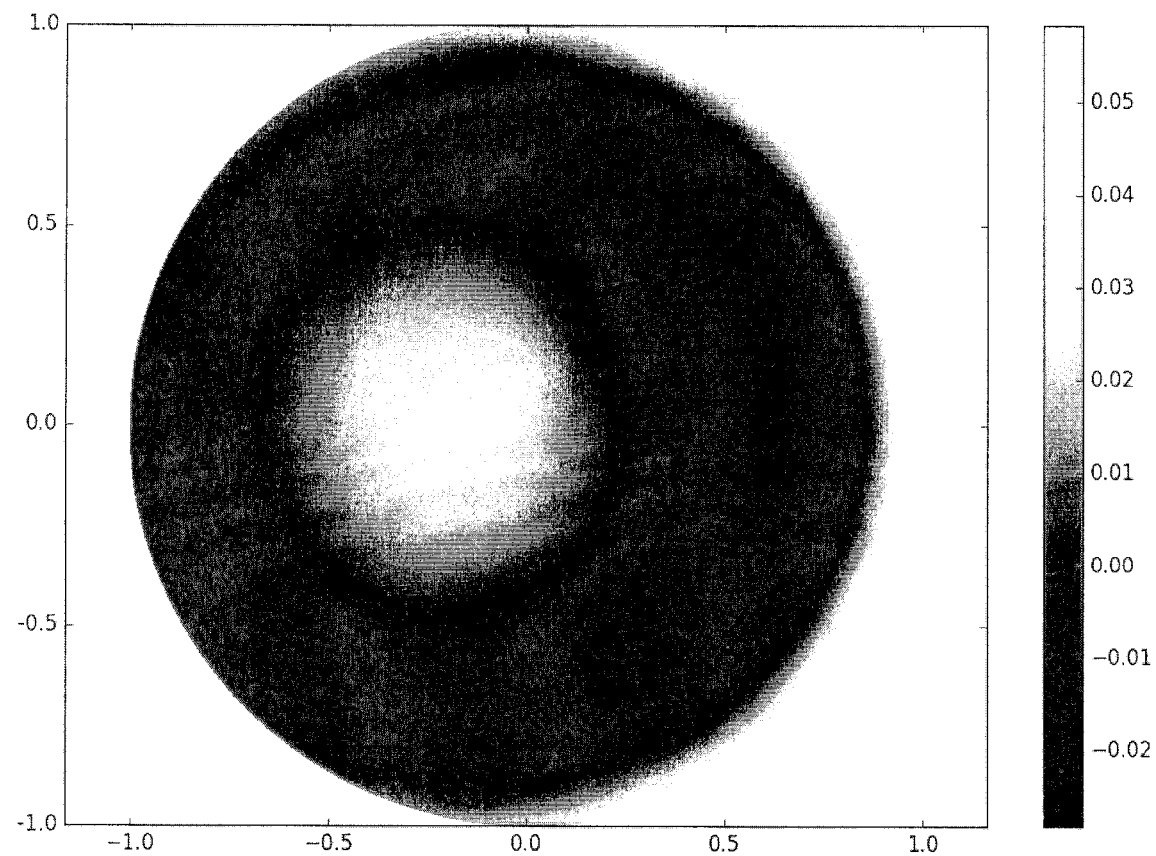
FIG. 17 is a grey-scale topographical map of the surface of FIG. 16.

In some embodiments, the Z8 and Z11 Zernike coefficients may be equal and may be the largest Zernike coefficients in a series describing the surface of FIGS. 16 and 17. In some embodiments, the Z4 and Z5 coefficients may be the next largest, e.g., at between 3% and 15% of Z8. The Z9, Z12, and Z17 coefficients may be the next largest, at between 0.1% and 3% of Z8.

In some embodiments, a variety of other surfaces may be implemented to adjust other aberrations, for example individual aberrations or multiple aberrations. In some embodiments, the selection of Zernike coefficients may depend upon the direction of translation of the optical elements relative to one another. For example, in some embodiments, each of the nonzero Zernike coefficients may describe a Zernike surface that is reflectively symmetric about an axis corresponding to the direction of movement passing through a center of the unit circle. For example, using the convention above in which movement is shown in the Y direction, corresponding embodiments may include surfaces with nonzero Zernike coefficients selected among the following Zernike coefficient indices: 1, 3, 4, 5, 8, 9, 11, 12, 15, 16, 17, 20, 21, 24, 25, 27, 28, 31, 32, 35, 36, and 37. In other embodiments, movement in the X direction, corresponding to the arrangement above, may have nonzero non-zero Zernike coefficients selected among the following Zernike coefficient indices: 1, 2, 4, 5, 7, 9, 10, 12, 14, 16, 17, 19, 21, 23, 25, 26, 28, 30, 32, 34, 36, and 37. In both of these cases the other Zernike coefficients may be zero (e.g., substantially zero) to maintain or approximate the relevant symmetries.

Embodiments have been described herein in relation to diffraction-based metrology, which, for example, measures the relative position of overlapping periodic structures from the intensity from the diffracted orders. However, embodiments herein may be applied, with appropriate modification where needed, to image-based metrology, which, for example, measures the relative position from target 1 in layer 1 to target 2 in layer 2 using high-quality images of the targets. Usually these targets are periodic structures or "boxes" (Box-in-Box (BiB)).

Figure 18:
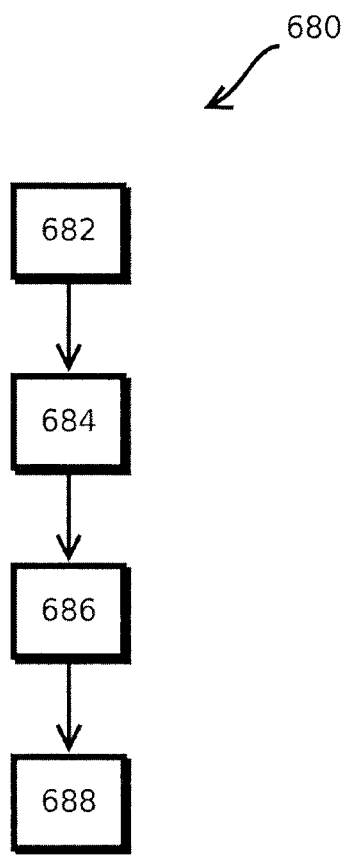
FIG. 18 is a process performed during operation of some of the above-described embodiments.

FIG. 18 is a flow chart of a process 680 performed during operation of some of the above-described embodiments of metrology tools having adaptive optical systems. In some embodiments, the process 680 includes determining an adjustment to an aberration of a beam of electromagnet (EM) radiation by which a patterned substrate is to be measured, as indicated by block 682. The process 680 may include moving a first aspheric optical element relative to a second aspheric optical element in a direction perpendicular to the beam, as indicated by block 684. The process may further include aberrating the beam differently after the movement than before the movement, as indicated by block 686. The process may also include measuring the patterned substrate, as indicated by block 688. In some cases, this process 680 may be repeated for multiple measurement locations on a substrate and for multiple substrates. In some embodiments, the result of such measurements may be communicated to the above-described lithography equipment, which may adjust process parameters to exercise feedback control of a process by which electrical, optical, or mechanical devices are patterned.

Although specific reference may have been made above to the use of embodiments in the context of metrology and optical lithography, it will be appreciated that embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an element" or "a element" includes a combination of two or more elements, notwithstanding use of other terms and phrases for one or more elements, such as "one or more," The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Statements in which a plurality of attributes or functions are mapped to a plurality of objects (e.g., one or more processors performing steps A, B, C, and D) encompasses both all such attributes or functions being mapped to all such objects and subsets of the attributes or functions being mapped to subsets of the attributes or functions (e.g., both all processors each performing steps A-D, and a case in which processor 1 performs step A, processor 2 performs step B and part of step C, and processor 3 performs part of step C and step D), unless otherwise indicated. Further, unless otherwise indicated, statements that one value or action is "based on" another condition or value encompass both instances in which the condition or value is the sole factor and instances in which the condition or value is one factor among a plurality of factors. Unless otherwise indicated, statements that "each"

instance of some collection have some property should not be read to exclude cases where some otherwise identical or similar members of a larger collection do not have the property, i.e., each does not necessarily mean each and every. Limitations as to sequence of recited steps should not be read into the claims unless explicitly specified, e.g., with explicit language like "after performing X, performing Y," in contrast to statements that might be improperly argued to imply sequence limitations, like "performing X on items, performing Y on the X'ed items," used for purposes of making claims more readable rather than specifying sequence. Unless specifically stated otherwise, as apparent from the discussion, it is appreciated that throughout this specification discussions utilizing terms such as "processing," "computing," "calculating," "determining" or the like refer to actions or processes of a specific apparatus, such as a special purpose computer or a similar special purpose electronic processing/computing device.

In this patent, certain U.S. patents, U.S. patent applications, or other materials (e.g., articles) have been incorporated by reference. The text of such U.S. patents, U.S. patent applications, and other materials is, however, only incorporated by reference to the extent that no conflict exists between such material and the statements and drawings set forth herein. In the event of such conflict, the text of the present document governs.

The present techniques will be better understood with reference to the following enumerated embodiments:

1. An apparatus, comprising: an optical metrology tool configured to measure structures patterned on a substrate, the optical metrology tool comprising: an electromagnetic (EM) radiation source configured to direct a beam of EM radiation along an EM radiation path; an adaptive optical system disposed in a portion of the EM radiation path and configured to adjust a shape of a wave front of the beam of EM radiation, the adaptive optical system comprising: a first aspherical optical element; a second aspherical optical element adjacent the first aspherical optical element; and an actuator configured to cause relative movement between the first optical element and the second optical element in a direction different from a beam axis of the portion of the EM radiation path.

2. The apparatus of clause 1, wherein: the optical metrology tool comprises a scatterometry metrology tool; the relative movement is a linear translation of one of the optical elements in a direction perpendicular to the beam axis, and the linear translation adjusts focus of the EM radiation and tilt of the EM radiation.

3. The apparatus of any of clauses 1-2 wherein: the first optical element and the second optical element have complementary curved surfaces including a non-zero Z7 or Z8 Zernike polynomial coefficient in Zernike series corresponding to the complementary curved surfaces.

4. The apparatus of clause 3, wherein: the first optical element comprises a planar surface normal to the beam axis.

5. The apparatus of clause 3, wherein: the Z7 or Z8 Zernike polynomial coefficient is larger than or equal to other Zernike polynomial coefficients of the Zernike series corresponding to the complementary curved surfaces.

6. The apparatus of any of clauses 1-5, wherein: a curved surface of the first optical element is reflectively symmetric about the direction of relative movement and rotationally symmetric about an axis orthogonal to both the direction of relative movement and the beam axis.

7. The apparatus of any of clauses 1-6, wherein: the adaptive optical system comprises means for causing relative movement between the first optical element and the second optical element.

8. The apparatus of any of clauses 1-7, wherein: the first optical element and the second optical element have one and only one degree of freedom of movement relative to one another.

9. The apparatus of clause 8, wherein: the one degree of freedom is linear translation perpendicular to the beam axis.

10. The apparatus of any of clauses 1-9, comprising: means for adaptively reducing tilt in the beam caused by the relative movement between the first optical element and the second optical element.

11. The apparatus of any of clauses 1-10, wherein: the adaptive optical system is configured to adjust a Z4 Zernike polynomial coefficient of a Zernike series corresponding to a wave front of the EM radiation responsive to the relative movement.

12. The apparatus of clause 11, wherein: the adjustment to the Z4 Zernike polynomial coefficient is proportionate to the relative movement.

13. The apparatus of clause 11, wherein: the adaptive optical system is configured such that the relative movement also causes an adjustment to the Z3 Zernike polynomial coefficient of the wave front, wherein the amount of adjustment to the Z3 Zernike polynomial coefficient is less than 50% of the adjustment of the Z4 Zernike polynomial coefficient over a range of relative movement the actuator is configured to drive.

14. The apparatus of any of clauses 1-13, wherein: the adaptive optical system is configured to affect higher order Zernike polynomial coefficients of the wave front than the Z4 Zernike polynomial coefficient in response to the relative movement between the first optical element and the second optical element.

15. The apparatus of any of clauses 1-14, wherein: the adaptive optical system is configured to adjust a trefoil aberration of the beam and a focus of the beam in response to the relative movement between the first optical element and the second optical element.

16. The apparatus of any of clauses 1-15, wherein: a curved surface of the first optical element corresponds to a Zernike series having a higher than third order Zernike polynomial with a non-zero Zernike coefficient.

17. The apparatus of any of clauses 1-16, wherein: the relative movement includes movement of the first optical element in a first direction and movement of the second optical element in a second direction opposite the first direction.

18. The apparatus of any of clauses 1-17, comprising: tiltable mirror configured to adjust tilt of the beam in a direction that reduces changes in tilt caused by the relative movement of the first optical element and the second optical element.

19. The apparatus of any of clauses 1-18, comprising: a lithographic apparatus communicatively coupled to the metrology tool, wherein the metrology tool comprises a scatterometry metrology tool configured to measure structures on a substrate patterned by the lithographic apparatus that are smaller than a wavelength of EM radiation used to measure the structures.

20. A method, comprising: determining an adjustment to an aberration of a beam of electromagnet (EM) radiation by which a patterned substrate is to be measured; moving a first aspheric optical element relative to a second aspheric optical element in a direction perpendicular to the beam; aberrating the beam differently after the movement than before the movement; and measuring the patterned substrate.

The invention claimed is:

1. An apparatus, comprising:
an optical metrology tool configured to measure structures, the optical metrology tool comprising:
an objective configured to provide EM radiation to an object having the structures and to collect radiation redirected by and from the object; and
an adaptive optical system disposed in a portion of the EM radiation path and configured to adjust a shape of a wave front of a beam of the EM radiation, the adaptive optical system comprising:
a first aspherical optical element;
a second aspherical optical element adjacent the first aspherical optical element;
an actuator configured to cause relative movement between the first optical element and the second optical element in a direction different from a beam axis of the portion of the EM radiation path; and
a control system configured to cause the actuator to cause the relative movement so as to least cause a change in position of a common focus point of the rays of the beam of EM radiation with respect to a surface in the optical metrology tool.

2. The apparatus of claim 1, wherein:
the optical metrology tool comprises a scatterometry metrology tool;
the relative movement is a linear translation of at least one of the optical elements in a direction perpendicular to the beam axis, and
the linear translation adjusts focus of the EM radiation and tilt of the EM radiation.

3. The apparatus of claim 1, wherein the first optical element and the second optical element have complementary curved surfaces including a non-zero Z7 or Z8 Zernike polynomial coefficient in a Zernike series corresponding to the complementary curved surfaces.

4. The apparatus of claim 3, wherein the first optical element comprises a planar surface normal to the beam axis.

5. The apparatus of claim 3, wherein the Z7 or Z8 Zernike polynomial coefficient is larger than or equal to other Zernike polynomial coefficients of the Zernike series corresponding to the complementary curved surfaces.

6. The apparatus of claim 1, wherein a curved surface of the first optical element is reflectively symmetric about the direction of relative movement and rotationally symmetric about an axis orthogonal to both the direction of relative movement and the beam axis.

7. The apparatus of claim 1, wherein the first optical element and the second optical element have one and only one degree of freedom of movement relative to one another.

8. The apparatus of claim 7, wherein the one degree of freedom is linear translation perpendicular to the beam axis.

9. The apparatus of claim 1, wherein the adaptive optical system is further configured to adaptively reduce tilt in the beam caused by the relative movement between the first optical element and the second optical element.

10. The apparatus of claim 1, wherein the adaptive optical system is configured to adjust a Z4 Zernike polynomial coefficient of a Zernike series corresponding to a wave front of the EM radiation responsive to the relative movement.

11. The apparatus of claim 10, wherein the adjustment to the Z4 Zernike polynomial coefficient is proportionate to the relative movement.

12. The apparatus of claim 10, wherein the adaptive optical system is configured such that the relative movement also causes an adjustment to the Z3 Zernike polynomial coefficient of the wave front, and wherein the amount of adjustment to the Z3 Zernike polynomial coefficient is less than 50% of the adjustment of the Z4 Zernike polynomial coefficient over a range of relative movement that the actuator is configured to drive.

13. The apparatus of claim 1, wherein the adaptive optical system is configured to affect higher order Zernike polynomial coefficients of the wave front than a Z4 Zernike polynomial coefficient in response to the relative movement between the first optical element and the second optical element.

14. The apparatus of claim 1, wherein the adaptive optical system is configured to adjust a trefoil aberration of the beam and a focus of the beam in response to the relative movement between the first optical element and the second optical element.

15. The apparatus of claim 1, wherein a curved surface of the first optical element corresponds to a Zernike series having a higher than third order Zernike polynomial with a non-zero Zernike coefficient.

16. The apparatus of claim 1, wherein the relative movement includes movement of the first optical element in a first direction and movement of the second optical element in a second direction opposite the first direction.

17. The apparatus of claim 1, comprising a tiltable mirror configured to adjust tilt of the beam in a direction that reduces changes in tilt caused by the relative movement of the first optical element and the second optical element.

18. The apparatus of claim 1, comprising a lithographic apparatus communicatively coupled to the metrology tool, wherein the metrology tool comprises a scatterometry metrology tool configured to measure structures on a substrate patterned by the lithographic apparatus that are smaller than a wavelength of EM radiation used to measure the structures.

19. The apparatus of claim 1, wherein:
the optical metrology tool is configured to measure structures with measurement radiation and to determine a focus related parameter of the optical metrology tool using a focus radiation beam separate from the measurement radiation,
the adaptive optical system is disposed in a portion of the focus radiation path and configured to adjust a shape of a wave front of the focus radiation, and
the actuator is configured to cause relative movement between the first optical element and the second optical element in a direction different from a beam axis of the portion of the focus radiation path.

20. The apparatus of claim 1, wherein the control system is configured to cause the actuator to cause the relative movement so as to least cause a change in position of a common focus point of the rays of the beam of EM radiation with respect to the structures.

21. A method, comprising:
determining an adjustment to an aberration of a beam of electromagnet (EM) radiation by which a structure is to be measured in an optical metrology tool;
moving a first aspheric optical element relative to a second aspheric optical element in a direction perpendicular to the beam;
aberrating the beam differently after the movement than before the movement so as to at least cause a change in position of a common focus point of the rays of the beam with respect to a surface in the optical metrology tool; and
measuring the structure.

22. The method of claim 21, wherein aberrating the beam differently after the movement than before the movement causes at least cause a change in position of a common focus point of the rays of the beam with respect to the structure.

23. An apparatus, comprising:
an optical metrology tool configured to measure structures with measurement radiation and to determine a focus related parameter of the optical metrology tool using a focus radiation beam separate from the measurement radiation, the optical metrology tool comprising an adaptive optical system disposed in a portion of the focus radiation path and configured to adjust a shape of a wave front of the focus radiation, the adaptive optical system comprising:
a first aspherical optical element;
a second aspherical optical element adjacent the first aspherical optical element; and
an actuator configured to cause relative movement between the first optical element and the second optical element in a direction different from a beam axis of the portion of the focus radiation path.

\* \* \* \* \*